US006566821B2

(12) United States Patent
Nakatsuka et al.

(10) Patent No.: US 6,566,821 B2
(45) Date of Patent: May 20, 2003

(54) DRIVE DEVICE AND DRIVE METHOD FOR A COLD CATHODE FLUORESCENT LAMP

(75) Inventors: Hiroshi Nakatsuka, Osaka (JP); Takeshi Yamaguchi, Kanagawa (JP); Katsu Takeda, Osaka (JP); Katsunori Moritoki, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/024,415

(22) Filed: Dec. 21, 2001

(65) Prior Publication Data

US 2002/0121865 A1 Sep. 5, 2002

(30) Foreign Application Priority Data

Dec. 28, 2000 (JP) ....................................... 2000-402001

(51) Int. Cl.7 .......................... H01L 41/08; H05B 41/16
(52) U.S. Cl. ............................ 315/209 PZ; 310/316.01
(58) Field of Search ............................ 315/55, 209 PZ, 315/307, 209 R; 310/316.01, 317, 319, 359, 366, 358; 363/40, 15

(56) References Cited

U.S. PATENT DOCUMENTS 5,923,546 A * 7/1999 Shimada et al. .............. 363/40
6,013,969 A * 1/2000 Noma et al. ................ 310/318
6,087,757 A 7/2000 Honbo et al. .......... 310/316.01
6,153,962 A * 11/2000 Noma et al. ........... 310/316.01
6,226,196 B1 * 5/2001 Toshinari et al. ........... 363/134

FOREIGN PATENT DOCUMENTS

JP 11-8087 1/1999
JP 11-27955 1/1999

* cited by examiner

*Primary Examiner*—Don Wong
*Assistant Examiner*—Chuc Tran
(74) *Attorney, Agent, or Firm*—Greenblum & Bernstein, P.L.C.

(57) ABSTRACT

The present invention relates to a drive device for one or more series-connected cold cathode fluorescent lamps having an electrical terminal at each end. The drive device has a piezoelectric transformer for converting by means of the piezoelectric effect a primary ac input applied to primary electrodes to a secondary ac output, which is removed from secondary electrodes; a drive arrangement for applying the primary ac input to the primary electrodes; and a brightness control circuit for controlling brightness. The drive device is configured so that the end electrical terminals of the cold cathode fluorescent lamp can be connected between the two secondary electrodes. The brightness control circuit detects the phase difference between the secondary ac output and the primary ac input. When the detected phase difference is greater than a specified phase difference, the drive arrangement reduces the power of the primary ac input applied to the primary electrodes. If the detected phase difference is less than the specified phase difference, the drive arrangement increases the power of the primary ac input applied to the primary electrodes.

28 Claims, 25 Drawing Sheets

DRIVE DEVICE AND DRIVE METHOD FOR A COLD CATHODE FLUORESCENT LAMP

BACKGROUND OF THE INVENTION

1. Field of the Invention

The present invention relates to a liquid crystal backlight device, and relates more particularly to the drive device for a cold cathode fluorescent lamp using a piezoelectric transformer and used for the backlight device in liquid crystal displays such as used in personal computers, flat panel monitors, and flat panel televisions.

2. Description of Related Art

Piezoelectric transformers achieve extremely high voltage gain when the load is unlimited, and the gain ratio decreases as the load decreases. Other advantages of piezoelectric transformers are that they are smaller than electromagnet transformers, noncombustible, and do not emit noise due to electromagnetic induction. Piezoelectric transformers are used as the power supply for cold cathode fluorescent lamps due to these features.

FIG. 26 shows the configuration of a Rosen-type piezoelectric transformer, a typical piezoelectric transformer according to the prior art. As shown in FIG. 26, this piezoelectric transformer has a low impedance part 510, high impedance part 512, input electrodes 514D and 514U, output electrode 516, and piezoelectric bodies 518 and 520. Reference numeral 522 indicates the polarization direction of the piezoelectric body 518 in the low impedance part 510, reference numeral 524 indicates the polarization direction in piezoelectric body 520, and reference numeral 610 indicates the piezoelectric transformer.

When piezoelectric transformer 610 is used for voltage gain, the low impedance part 510 is the input side. As indicated by polarization direction 522 the low impedance part 510 is polarized in the thickness direction, and input electrodes 514U and 514D are disposed on the primary front and surfaces in the thickness direction. The high impedance part 512 is the output part when the piezoelectric transformer is used for voltage gain. As indicated by polarization direction 524 the high impedance part 512 is polarized lengthwise and has output electrode 516 on the lengthwise end of the transformer.

A specific ac voltage applied between input electrodes 514U and 514D excites a lengthwise expansion and contraction vibration, which piezoelectric effect of the piezoelectric transformer 610 converts to a voltage between input electrode 514U and output electrode 516. Voltage gain or drop results from impedance conversion by the low impedance part 510 and high impedance part 512.

A cold cathode fluorescent lamp with a cold cathode configuration not having a heater for the discharge electrode is generally used for the backlight of a LCD. The striking voltage for starting the lamp and the operating voltage for maintaining lamp output are both extremely high in a cold cathode fluorescent lamp due to the cold cathode design. An operating voltage of 800 Vrms and striking voltage of 1300 Vrms are generally required for a cold cathode fluorescent lamp used in a 14-inch class LCD. As LCD size increases and the cold cathode fluorescent lamp becomes longer, the striking voltage and operating voltage are expected to rise.

FIG. 27 is a block diagram of a self-excited oscillating drive circuit for a prior art piezoelectric transformer. Variable oscillator 616 generates the ac drive signal for driving piezoelectric transformer 610. The variable oscillator 616 generally outputs a pulse wave from which the high frequency component is removed by wave shaping circuit 612 for conversion to a near-sine wave ac signal. Drive circuit 614 amplifies output from wave shaping circuit 612 to a level sufficient to drive the piezoelectric transformer 610. The amplified voltage is input to the primary electrode of piezoelectric transformer 610. The voltage input to the primary electrode is stepped up by the piezoelectric effect of the piezoelectric transformer 610, and removed from the secondary electrode.

The high voltage output from the secondary side is applied to over-voltage protection circuit 630 and the serial circuit formed by cold cathode fluorescent lamp 626 and feedback resistance 624. The over-voltage protection circuit 630 consists of voltage-dividing resistances 628*a* and 628*b*, and comparator 620 for comparing the voltages detected at the node between voltage-dividing resistances 628*a* and 628*b* with a set voltage. The over-voltage protection circuit 630 controls the oscillation control circuit 618 to prevent the high voltage potential output from the secondary electrode of the piezoelectric transformer from becoming greater than the set voltage. The over-voltage protection circuit 630 does not operate when the cold cathode fluorescent lamp 626 is on.

In the over-voltage protection circuit 630, the voltage occurring at both ends of the feedback resistance 624 is applied to the comparator 620 as a result of the current flowing to the series circuit of cold cathode fluorescent lamp 626 and feedback resistance 624. The comparator 620 compares the set voltage with the feedback voltage, and applies a signal to the oscillation control circuit 618 so that a substantially constant current flows to the cold cathode fluorescent lamp 626. Oscillation control circuit 618 output applied to the variable oscillator 616 causes the variable oscillator 616 to oscillate at a frequency matching the comparator output. The comparator 620 does not operate until the cold cathode fluorescent lamp 626 is on.

Cold cathode fluorescent lamp output is thus stable. This self-exciting drive method enables the drive frequency to automatically track the resonance frequency even when the resonance frequency varies because of the temperature.

This piezoelectric inverter configuration makes it possible to maintain a constant current flow to the cold cathode tube.

As shown in FIG. 23, a method of driving the cold cathode fluorescent lamp by parallel driving two piezoelectric transformers, and a drive method wherein the two output electrodes of the piezoelectric transformers are connected to two input terminals of the cold cathode fluorescent lamp, have been proposed as a way to prevent uneven brightness. The cold cathode fluorescent lamp in these cases is connected as shown in FIG. 25.

Similarly to the drive circuit shown in FIG. 27, these drive circuits also need feedback of current flow to the lamp in order to control the frequency or voltage. It is alternatively possible to detect and feed back the cold cathode fluorescent lamp brightness.

Piezoelectric transformer output current or output voltage is held constant in order to hold the cold cathode fluorescent lamp brightness constant, or current flow to the reflector is detected and fed back for control.

A conventional piezoelectric transformer and drive circuit therefore thus connect a resistance near the cold cathode fluorescent lamp ground and use the voltage of this resistance in order to control the brightness of the cold cathode fluorescent lamp when the cold cathode fluorescent lamp is on. A problem with this method is that uneven brightness occurs as a result of current leaks.

To resolve this problem, Japanese Laid-Open Patent Publication No.11-8087 teaches a means for inputting 180° different phase voltages from opposite ends of the cold cathode fluorescent lamp. This configuration is shown in FIG. 22. However, when a cold cathode fluorescent lamp is connected as shown in FIG. 22, current flows to the reflector from the cold cathode fluorescent lamp 330 on the high potential side, and current flows from the reflector to the cold cathode fluorescent lamp on the low potential side. Piezoelectric transformer output current thus contains both current flowing to the lamp and current flowing to a parasitic capacitance. As a result, the output current detection circuit 344 in the drive circuit of a piezoelectric transformer 340 configured as shown in FIG. 25 thus detects both the current flowing to the cold cathode fluorescent lamp 346 and the leakage current of the parasitic capacitance 348 consisting of cold cathode fluorescent lamp 346 and reflector 350. If the parasitic capacitance 348 of the reflector 350 is constant, this constant parasitic capacitance can be taken into consideration to keep current flow to the cold cathode fluorescent lamp 346 constant. However, the parasitic capacitance 348 varies, the leakage current varies with the drive frequency, and it is therefore difficult in practice to maintain a constant current flow to the cold cathode fluorescent lamp 346. The drive circuit shown in FIG. 23 having two piezoelectric transformers also has this problem.

To address this problem, Japanese Laid-open Patent Publication No.11-27955 teaches a method for controlling lamp current by detecting leakage current with a parasitic capacitance current detection circuit, and detecting lamp current with a lamp current detection circuit. In a piezoelectric transformer that controls the drive frequency to maintain constant output using this method, however, the impedance will vary due to the parasitic capacitance if the leakage current frequency varies due to parasitic capacitance, or the parasitic capacitance varies with the unit. The leakage current thus varies. The circuit design must therefore consider both frequency and the effects of the unit, and the control circuit thus becomes more complex.

Furthermore, the cold cathode fluorescent lamp must be connected in series because the secondary terminal of the piezoelectric transformer and the load must be connected 1:1. The striking voltage required to start the lamp is thus doubled, and the operating voltage for keeping the lamp on is also necessarily high.

An object of the present invention is therefore to provide a drive circuit for a small, high efficiency piezoelectric transformer with discrete primary and secondary sides (a balanced output piezoelectric transformer) to maintain constant cold cathode fluorescent lamp brightness by electrically connecting plural cold cathode fluorescent lamps connected in series to the secondary terminal of the balanced output piezoelectric transformer, and controlling the phase difference of the input and output voltages of the piezoelectric transformer.

A further object is to provide high reliability piezoelectric transformer elements by reducing the striking voltage and operating voltage.

SUMMARY OF THE INVENTION

A drive device for a cold cathode fluorescent lamp according to the present invention drives one or a plurality of series-connected cold cathode fluorescent lamps having an electrical terminal at both ends, and comprises: a piezoelectric transformer having a pair of primary electrodes and first and second secondary electrodes, the piezoelectric transformer converting a primary ac input from the primary electrodes by a piezoelectric effect to a secondary ac output, outputting a secondary output in a first phase from the first secondary electrode and outputting a secondary output in a second phase opposite the first phase from the second secondary electrode, and enabling connection of the electrical terminals at both ends of the cold cathode fluorescent lamp between the one secondary electrode and the other secondary electrode; a drive arrangement for applying the primary ac input to the primary electrodes; and a brightness control circuit for controlling cold cathode fluorescent lamp brightness. The brightness control circuit detects a phase difference between the secondary ac output and primary ac input. When the detected phase difference is greater than a specified phase difference, the drive arrangement reduces the input power to the primary electrodes of the piezoelectric transformer to reduce the lamp brightness. When the detected phase difference is less than a specified phase difference, the drive arrangement increases the input power to the primary electrodes of the piezoelectric transformer to increase the lamp brightness. The detected phase difference is thus made equal to the specified phase difference.

This cold cathode fluorescent lamp drive device further preferably has a variable oscillation circuit for oscillating the primary ac input at a specified frequency; a startup control circuit for controlling the frequency of the primary ac input from the variable oscillation circuit to strike the cold cathode fluorescent lamp; and a startup detector for detecting cold cathode fluorescent lamp startup.

Yet further preferably, the startup control circuit controls the variable oscillation circuit to sweep the primary ac input from a specified frequency to a frequency below said frequency to strike the cold cathode fluorescent lamp, and controls the variable oscillation circuit to fix and oscillate at the frequency at which the startup detector detects cold cathode fluorescent lamp startup.

Yet further preferably, the brightness control circuit stops operating when striking the cold cathode fluorescent lamp.

Yet further preferably, the frequency of the primary ac input is a frequency other than a frequency at which the secondary side of the piezoelectric transformer shorts, and a frequency intermediate to the frequency at which the piezoelectric transformer secondary side shorts and the secondary side opens.

Yet further preferably, the primary ac input frequency is a frequency other than a frequency in the band ±0.3 kHz of the piezoelectric transformer resonance frequency when the secondary side shorts, and a frequency other than a frequency in the band ±0.3 kHz of the frequency intermediate to the resonance frequency of the piezoelectric transformer when the secondary side shorts and the resonance frequency when the secondary side is open.

Yet further preferably, the frequency of the primary ac input is higher than the frequency of the maximum step-up ratio of the piezoelectric transformer producing the lowest cold cathode fluorescent lamp load.

Yet further preferably, the cold cathode fluorescent lamp drive device additionally comprises an inductor connected in series with one primary electrode, forming a resonance circuit with the piezoelectric transformer. The drive arrangement comprises a dc power source, a drive control circuit for outputting a drive control signal based on the primary ac input frequency, and a drive circuit connected to the dc power source and both sides of the resonance circuit for amplifying the drive control signal to a voltage level required to drive the piezoelectric transformer, outputting the ac input signal to the resonance circuit, and inputting the ac voltage to the primary electrodes. The brightness control circuit comprises a voltage detector circuit for detecting the ac voltage of the secondary ac output from at least one of the secondary electrodes, and outputting an ac detection signal, a phase difference detector circuit for detecting a phase difference between the ac input signal and detected ac signal, and outputting a dc voltage according to the detected phase difference, a phase control circuit for controlling the phase of the drive control signal, and a comparison circuit for comparing the dc voltage and a reference voltage, and controlling the phase control circuit so that the dc voltage and reference voltage match.

Yet further preferably, the ac input signal frequency is near the resonance frequency of the resonance circuit.

Yet further preferably, the voltage detector circuit comprises: a level shifter for shifting the ac voltage of the secondary ac output to a specific voltage amplitude level; and a zero cross detection circuit for switching and outputting the ac detection signal when the level shifter output signal crosses zero.

Yet further preferably, the phase detector circuit comprises: a logical AND for taking the AND of the ac input signal and ac detection signal, and outputting a phase difference signal; and an averaging circuit for averaging the phase difference signal and outputting a dc voltage.

Yet further preferably, the drive circuit comprises: a first series connection having a first switching element and a second switching element connected in series; a second series connection parallel connected to the first series connection and having a third switching element and a fourth switching element connected in series; a first element drive circuit connected to the first switching element for driving the first switching element; a second element drive circuit connected to the second switching element for driving the second switching element; a third element drive circuit connected to the third switching element for driving the third switching element; and a fourth element drive circuit connected to the fourth switching element for driving the fourth switching element.

Yet further preferably, the resonance circuit is connected between the node between the first switching element and second switching element, and the node between the third switching element and fourth switching element.

In this case, the drive control signal preferably comprises: a first element control signal for driving the first element drive circuit; a second element control signal for driving the second element drive circuit; a third element control signal for driving the third element drive circuit; and a fourth element control signal for driving the fourth element drive circuit.

Yet further preferably in this case the first element control signal and second element control signal are controlled by the drive control circuit so that the first switching element and second switching element switch alternately on and off at a specific on time ratio; and the third element control signal and fourth element control signal are controlled by the drive control circuit so that the third switching element and fourth switching element switch alternately on and off at the same frequency and on time ratio as the first element control signal and second element control signal.

Yet further preferably, the first element control signal, second element control signal, third element control signal, or fourth element control signal is used in place of the ac input signal for phase difference signal detection.

Yet further preferably, the ac input signal is a rectangular signal combining the first element control signal, second element control signal, third element control signal, and fourth element control signal.

A cold cathode fluorescent lamp drive device according to a further aspect of this invention is a drive device for one or a plurality of series-connected cold cathode fluorescent lamps having an electrical terminal at both ends, comprising: a piezoelectric transformer having a pair of primary electrodes and first and second secondary electrodes, the piezoelectric transformer converting a primary ac input from the primary electrodes by a piezoelectric effect to a secondary ac output, outputting a secondary output in a first phase from the first secondary electrode and outputting a secondary output of a second phase opposite the first phase from the second secondary electrode, and enabling connection of the electrical terminals at both ends of the cold cathode fluorescent lamp between the first secondary electrode and the second secondary electrode; a variable oscillation circuit for oscillating the primary ac input at a specified frequency; a drive arrangement for applying the primary ac input to the primary electrodes; and a brightness control circuit for controlling cold cathode fluorescent lamp brightness. The brightness control circuit detects the ac voltage of the secondary ac output applied to the end electrical terminals of the cold cathode fluorescent lamp. When the detected ac voltage of the secondary ac output is greater than a specific voltage, the brightness control circuit controls the variable oscillation circuit so that the primary ac input frequency approaches the resonance frequency of the piezoelectric transformer. When the detected ac voltage of the secondary ac output is less than the specific voltage, the brightness control circuit controls the variable oscillation circuit so that the primary ac input frequency recedes from the resonance frequency of the piezoelectric transformer. The detected ac voltage of the secondary ac output and the specific voltage thus become equal.

A cold cathode fluorescent lamp drive device according to a further aspect of this invention is a drive device for one or a plurality of series-connected cold cathode fluorescent lamps having an electrical terminal at both ends, comprising: a piezoelectric transformer having a pair of primary electrodes and first and second secondary electrodes, the piezoelectric transformer converting a primary ac input from the primary electrodes by a piezoelectric effect to a secondary ac output, outputting a secondary output in a first phase from the first secondary electrode and outputting a secondary output of a second phase opposite the first phase from the second secondary electrode, and enabling connection of the electrical terminals at both ends of the cold cathode fluorescent lamp between the first secondary electrode and the second secondary electrode; a drive arrangement for applying the primary ac input to the primary electrodes; and a brightness control circuit for controlling cold cathode fluorescent lamp brightness. The brightness control circuit detects the ac voltage of the secondary ac output. When the detected ac voltage of the secondary ac output is greater than a specific voltage, the brightness control circuit controls the drive arrangement to lower the ac voltage of the primary ac input. When the detected ac voltage of the secondary ac output is less than a specific voltage, the brightness control circuit controls the drive arrangement to increase the ac voltage of the primary ac input. When the detected ac voltage of the secondary ac output is less than the specific voltage, the brightness control circuit controls the variable oscillation circuit so that the primary ac input frequency recedes from the resonance frequency of the piezoelectric transformer. The detected ac voltage of the secondary ac output and the specific voltage thus become equal.

A cold cathode fluorescent lamp device according to a further aspect of the invention has a cold cathode fluorescent lamp drive device according to the present invention, and one or a plurality of series-connected cold cathode fluorescent lamps having an electrical terminal at both ends connected between the first and the second secondary electrodes of the piezoelectric transformer.

A drive method for a cold cathode fluorescent lamp according to the present invention is a method for driving one or a plurality of series-connected cold cathode fluorescent lamps having an electrical terminal at both ends, comprising: applying a primary ac input from a drive arrangement to primary electrodes of a piezoelectric transformer, the piezoelectric transformer having a pair of primary electrodes and first and second secondary electrodes, the piezoelectric transformer converting the primary ac input from the primary electrodes by a piezoelectric effect to a secondary ac output, outputting a secondary output in a first phase from the first secondary electrode and outputting a secondary output in a second phase opposite the first phase from the second secondary electrode; striking the cold cathode fluorescent lamp connected with both end electrical terminals thereof connected between the first and the second secondary electrodes by applying the first phase secondary ac output to one of the electrical terminals, and applying the second phase second ac output to the other electrical terminal; detecting a phase difference between the secondary ac output and primary ac input by means of a brightness control circuit for controlling cold cathode fluorescent lamp brightness; controlling the drive arrangement to reduce primary ac input power to the primary electrodes of the piezoelectric transformer when the detected phase difference is greater than a specified phase difference; controlling the drive arrangement to increase primary ac input power to the primary electrodes of the piezoelectric transformer when the detected phase difference is less than a specified phase difference; and making the detected phase difference equal to the specified phase difference.

Preferably, a variable oscillation circuit for oscillating the primary ac input is controlled to sweep the primary ac input from a specified frequency to a frequency below said frequency to strike the cold cathode fluorescent lamp, and is then controlled to fix and oscillate at the frequency at which cold cathode fluorescent lamp startup is detected.

Further preferably, the frequency of the primary ac input is a frequency other than a frequency at which the secondary side of the piezoelectric transformer shorts, and a frequency intermediate to the frequency at which the piezoelectric transformer secondary side shorts and the secondary side opens.

Yet further preferably, the primary ac input frequency is a frequency other than a frequency in the band ±0.3 kHz of the piezoelectric transformer resonance frequency when the secondary side shorts, and a frequency other than a frequency in the band ±0.3 kHz of the frequency intermediate to the resonance frequency of the piezoelectric transformer when the secondary side shorts and the resonance frequency when the secondary side is open.

Yet further preferably, the frequency of the primary ac input is higher than the frequency of the maximum step-up ratio of the piezoelectric transformer producing the lowest cold cathode fluorescent lamp load.

A drive method for driving one or a plurality of series-connected cold cathode fluorescent lamps having an electrical terminal at both ends according to a further aspect of the invention comprises: applying a primary ac input oscillated by a variable oscillation circuit from a drive arrangement to primary electrodes of a piezoelectric transformer, the piezoelectric transformer having a pair of primary electrodes and first and second secondary electrodes, the piezoelectric transformer converting the primary ac input from the primary electrodes by a piezoelectric effect to a secondary ac output, outputting a secondary output in a first phase from the first secondary electrode and outputting a secondary output in a second phase opposite the first phase from the second secondary electrode; striking the cold cathode fluorescent lamp connected with both end electrical terminals thereof connected between the first and the second secondary electrodes by applying the first phase secondary ac output to one of the electrical terminals, and applying the second phase second ac output to the other electrical terminal; detecting an ac voltage of the secondary ac output applied to the end electrical terminals of the cold cathode fluorescent lamp by means of a brightness control circuit for controlling cold cathode fluorescent lamp brightness; controlling the drive arrangement to reduce the ac voltage of the primary ac input when the detected ac voltage of the secondary ac output is greater than a specified voltage; controlling the drive arrangement to increase the ac voltage of the primary ac input when the detected ac voltage of the secondary ac output is less than a specified voltage; and making the detected ac voltage of the secondary ac output equal to the specified voltage.

A drive method for driving one or a plurality of series-connected cold cathode fluorescent lamps having an electrical terminal at both ends according to a yet further aspect of the invention comprises: applying a primary ac input oscillated by a variable oscillation circuit from a drive arrangement to primary electrodes of a piezoelectric transformer, the piezoelectric transformer having a pair of primary electrodes and first and second secondary electrodes, the piezoelectric transformer converting the primary ac input from the primary electrodes by a piezoelectric effect to a secondary ac output, outputting a secondary output in a first phase from the first secondary electrode and outputting a secondary output in a second phase opposite the first phase from the second secondary electrode; striking the cold cathode fluorescent lamp connected with both end electrical terminals thereof connected between the first and the second secondary electrodes by applying the first phase secondary ac output to one of the electrical terminals, and applying the second phase second ac output to the other electrical terminal; detecting an ac voltage of the secondary ac output applied to the end electrical terminals of the cold cathode fluorescent lamp by means of a brightness control circuit for controlling cold cathode fluorescent lamp brightness; controlling the variable oscillation circuit so that the primary ac input frequency approaches the resonance frequency of the piezoelectric transformer when the detected ac voltage of the secondary ac output is greater than a specific voltage; controlling the variable oscillation circuit so that the primary ac input frequency recedes from the resonance frequency of the piezoelectric transformer when the detected ac voltage of the secondary ac output is less than the specific voltage; and making the detected ac voltage of the secondary ac output and the specific voltage equal.

Yet further preferably, the primary ac input comprises the pulse signals of a plurality of switching elements driven by pulse signals, and the primary ac input is applied to the primary electrodes; and phase difference detection by the brightness control circuit detects a phase difference between pulse signals input to the switching elements, and the secondary ac output converted to a rectangular wave pulse signal by zero cross detection.

Other objects and attainments together with a fuller understanding of the invention will become apparent and appreciated by referring to the following description and claims taken in conjunction with the accompanying drawings.

DESCRIPTION OF THE PREFERRED EMBODIMENTS

Preferred embodiments of the present invention are described below with reference to the accompanying figures.

Figure 1:
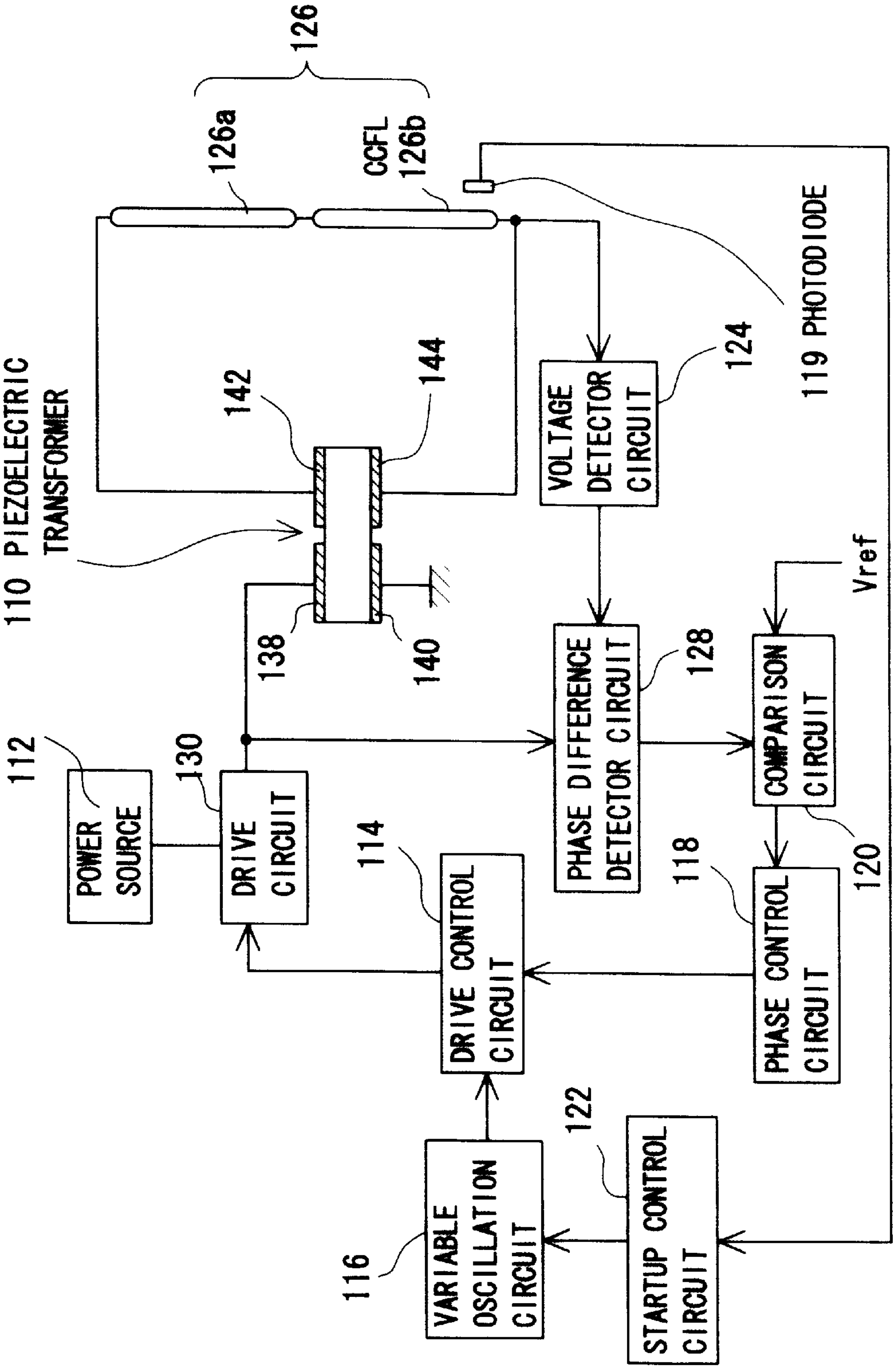
FIG. 1 is a block diagram of a drive circuit for a cold cathode discharge tube according to a first embodiment of the present invention.

FIG. 1 is a block diagram of a drive circuit for a cold cathode discharge tube according to a first embodiment of the present invention. The configuration of a piezoelectric transformer used in this embodiment of the invention is shown in FIG. 2.

Figure 2:
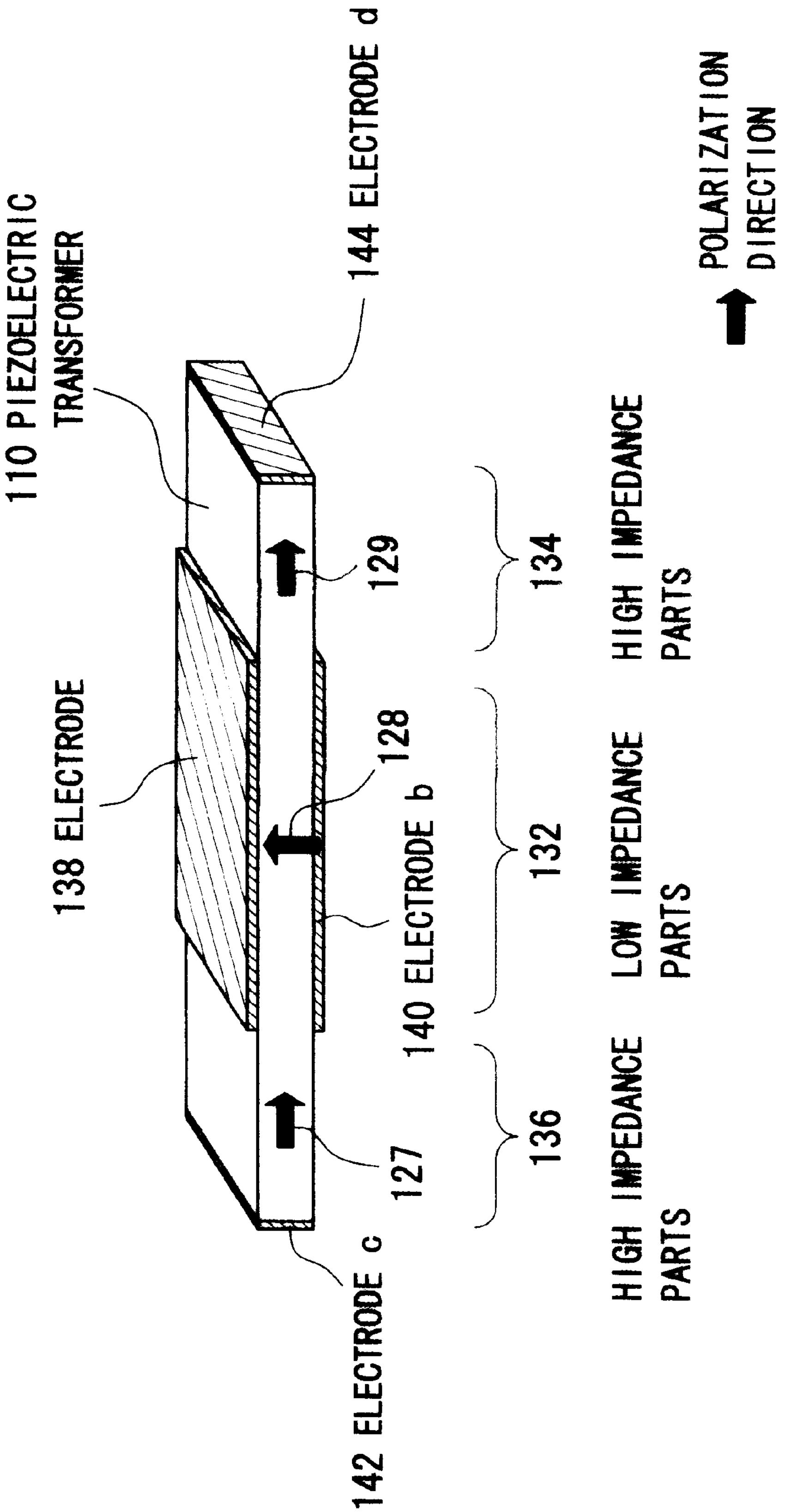
FIG. 2 is an oblique view of a piezoelectric transformer used in the first embodiment of the invention.

The piezoelectric transformer shown in FIG. 2 is a center drive type piezoelectric transformer comprising high impedance parts 134 and 136, and low impedance part 132. The low impedance part 132 is disposed between high impedance part 134 and high impedance part 136, and is the input part of the step-up transformer. The low impedance part 132 has electrode a 138 and electrode b 140 formed on the main surfaces in the thickness direction of the rectangular body. As shown by arrow 128, the polarization direction is in the thickness direction of the piezoelectric transformer 110 when ac voltage is applied between electrode a 138 and electrode b 140.

Electrode c 142 is formed on the main surface on or near one end in the thickness direction of the piezoelectric transformer 110 in the high impedance part 136. The direction of polarization when ac voltage is applied between electrode c 142 and electrode a 138 or electrode b 140 is, as indicated by arrow 127, in the lengthwise direction of the piezoelectric transformer 110.

Electrode d 144 is similarly formed on the main surface on or near one end in the thickness direction of the piezoelectric transformer 110 in the other high impedance part 134. The direction of polarization when ac voltage is applied between electrode d 144 and electrode a 138 or electrode b 140 is also in the lengthwise direction of the piezoelectric transformer 110 as indicated by arrow 129. Note that the direction of polarization is the same for both high impedance parts 134 and 136 at this time.

Figure 3:
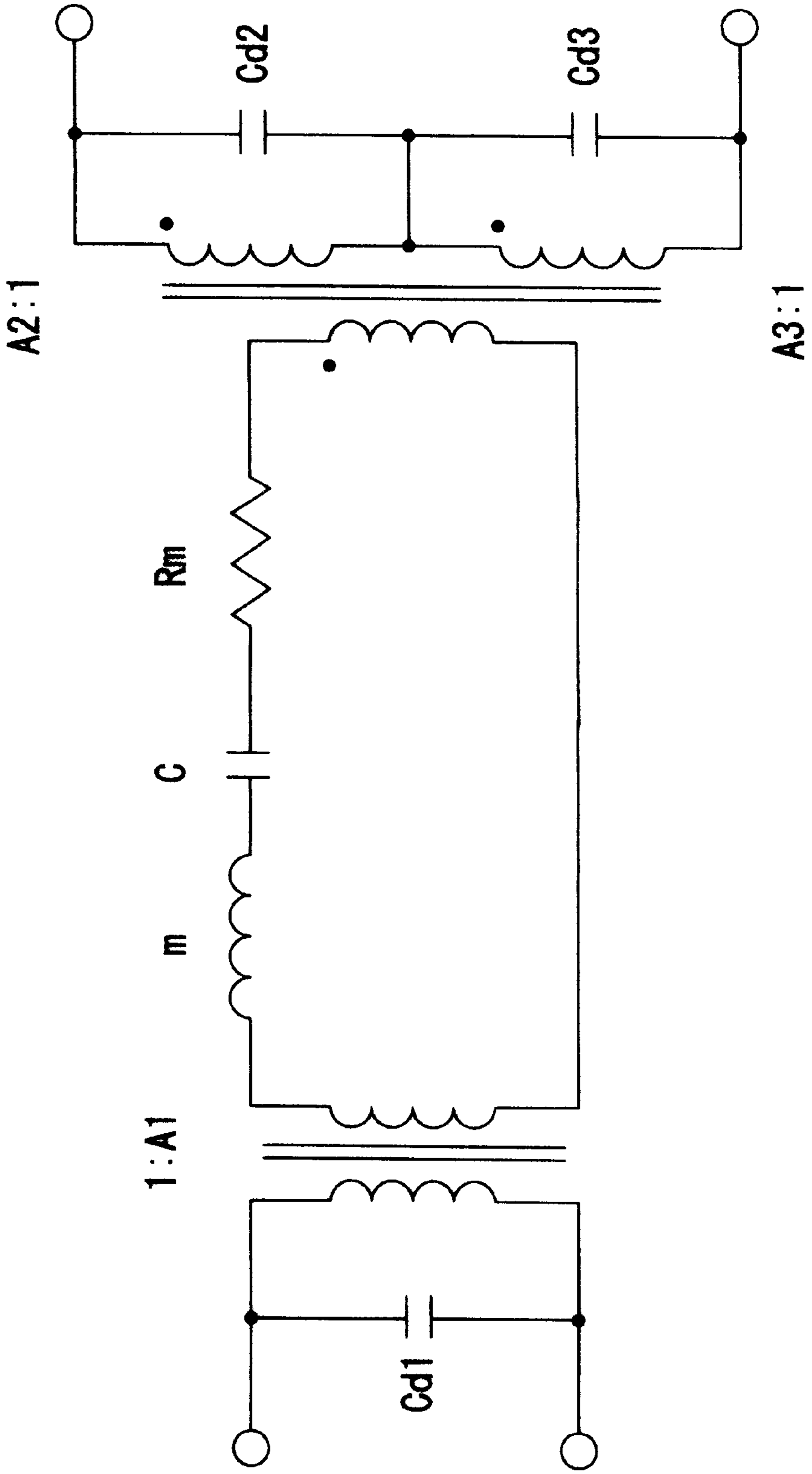
FIG. 3 shows an equivalent circuit for the piezoelectric transformer shown in FIG. 2.

Operation of a piezoelectric transformer thus comprised is described next with reference to FIGS. 3 to 6. A lumped-constant equivalent circuit approximating the resonance frequency of the piezoelectric transformer 110 is shown in FIG. 3. In FIG. 3 reference numerals Cd1, Cd2, Cd3 are input and output side bound capacitances; A1 (input side), A2 (output side), and A3 (output side) are power coefficients; m is equivalent mass; C is equivalent compliance; and Rm is equivalent mechanical resistance. In a piezoelectric transformer 110 according to this first embodiment of the invention power coefficient A1 is greater than A2 and A3, and in the equivalent circuit shown in FIG. 3 is boosted by two equivalent ideal transformers. Furthermore, because equivalent mass m and equivalent compliance C form a series resonance circuit in piezoelectric transformer 110, the output voltage is greater than the transformation ratio particularly when the load resistance is great.

Figure 4:
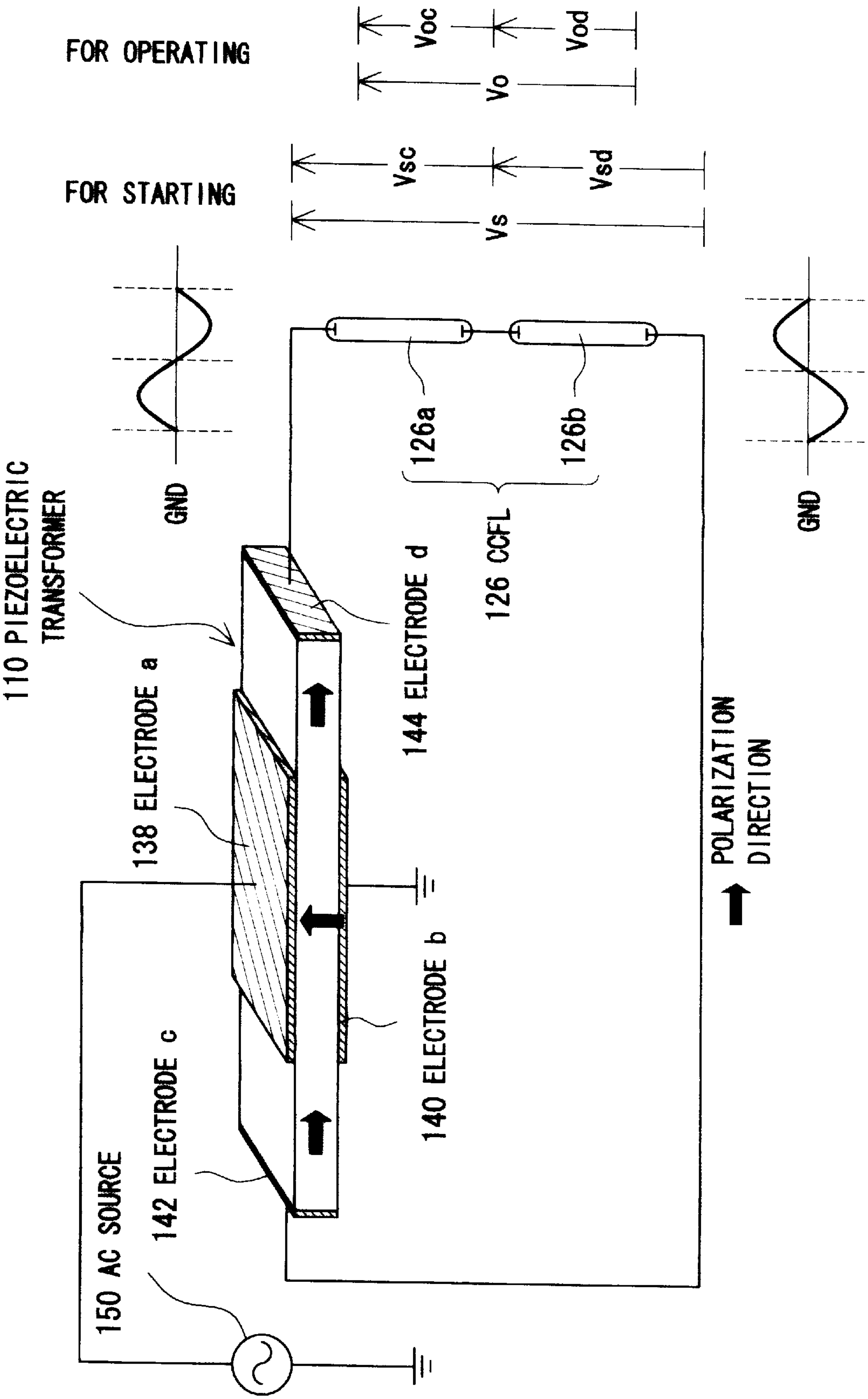
FIG. 4 shows the operation of the piezoelectric transformer shown in FIG. 2.

FIG. 4 shows how the piezoelectric transformer 110 of the present invention is connected to cold cathode fluorescent lamp 126 (referred to below as CCFL 126).

Shown in FIG. 4 are the piezoelectric transformer 110 shown in FIG. 2, ac source 150, and cold cathode fluorescent lamps 126*a* and 126*b*. Lamps 126*a* and 126*b* are connected in series, forming CCFL 126. AC source 150 is connected to primary side electrode a 138, and the other primary side electrode b 140 is connected to ground. One secondary electrode c 142 is connected to one electrical terminal of CCFL 126, and the other electrical terminal of CCFL 126 is connected to electrode d 144.

A piezoelectric transformer 110 configured as shown in FIG. 4 outputs voltages of substantially equal amplitude and 180° different phase from the two electrodes c 142 and d 144. Electrode c 142 and electrode d 144 output to the two electrical terminals at opposite ends of CCFL 126. CCFL 126 is thus driven by equal amplitude, 180° opposite phase voltages applied to different input terminals of the CCFL 126.

Note that in FIG. 4 Vs indicates the striking potential of CCFL 126, Vo indicates the operating potential, Vsc is the voltage applied to lamp 126*a* when striking CCFL 126, Voc is the voltage applied to lamp 126*a* to operate CCFL 126 once it is on, Vsd is the voltage applied to lamp 126*b* when starting CCFL 126, and Vod is the voltage applied to lamp 126*b* to once CCFL 126 is on.

Figure 5:
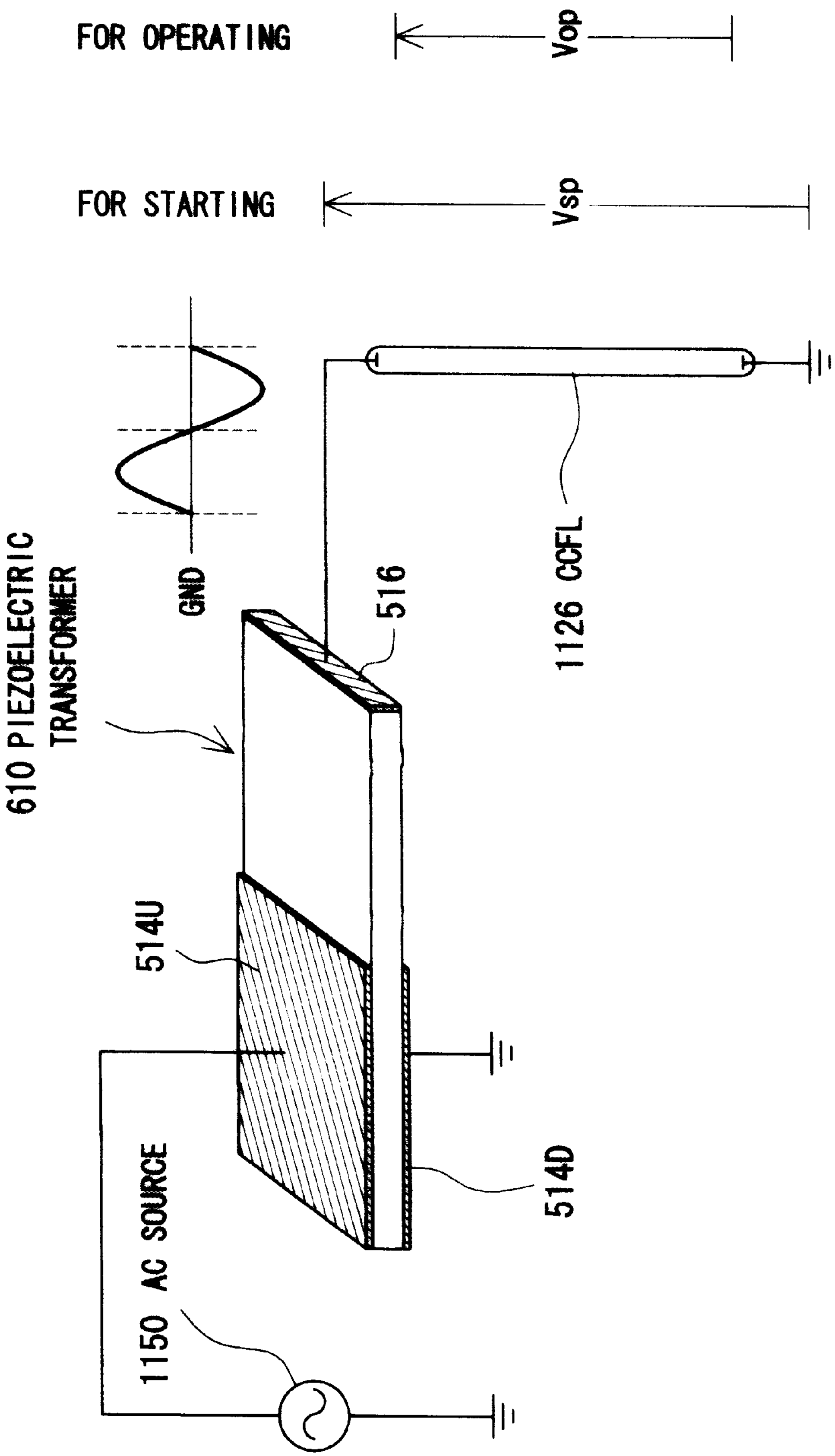
FIG. 5 shows the connection of a prior art piezoelectric transformer and cold cathode fluorescent lamp.
Figure 26:
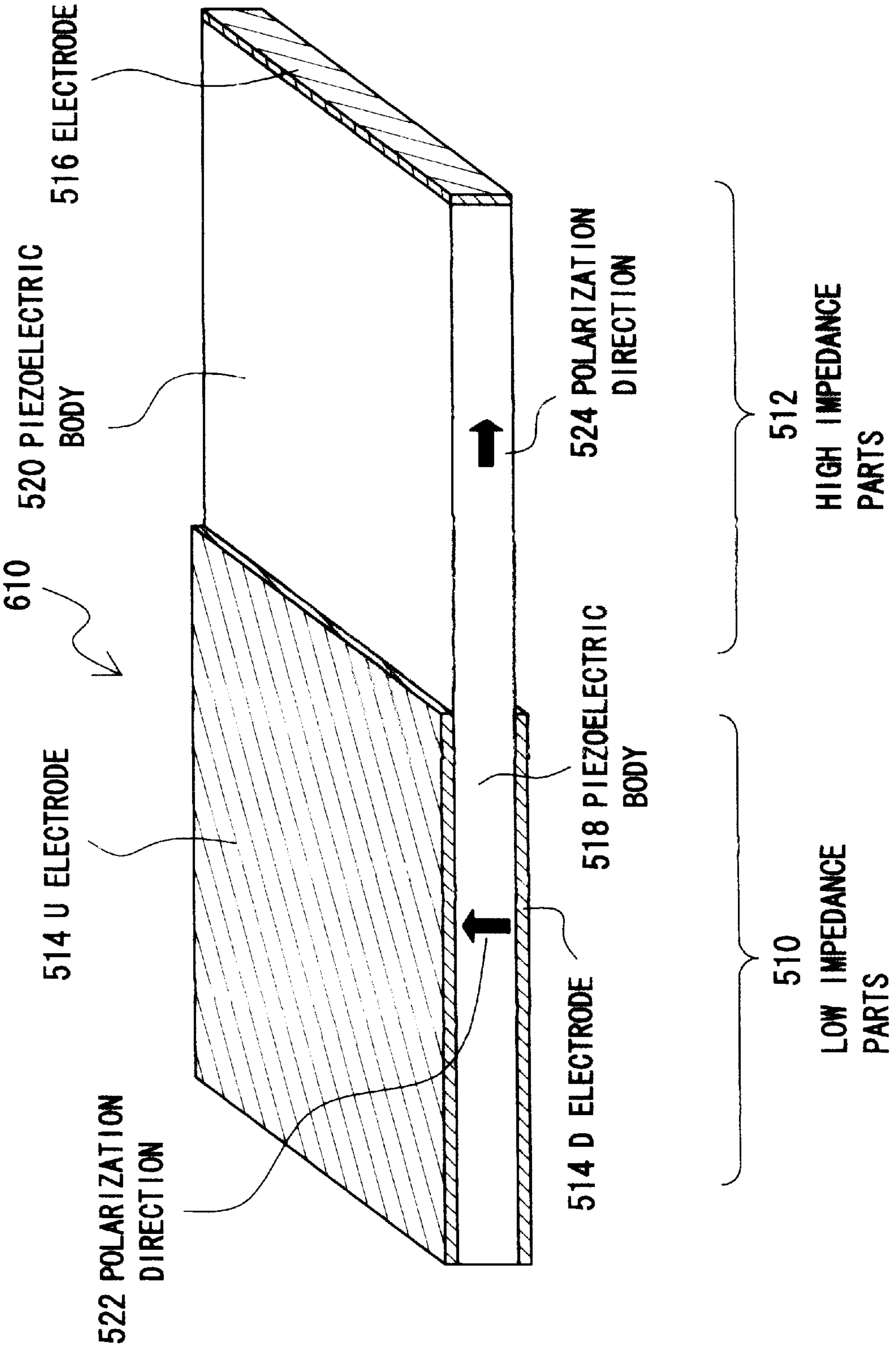
FIG. 26 is an oblique view OT a piezoelectric transformer according to another example of the prior art.
Figure 27:
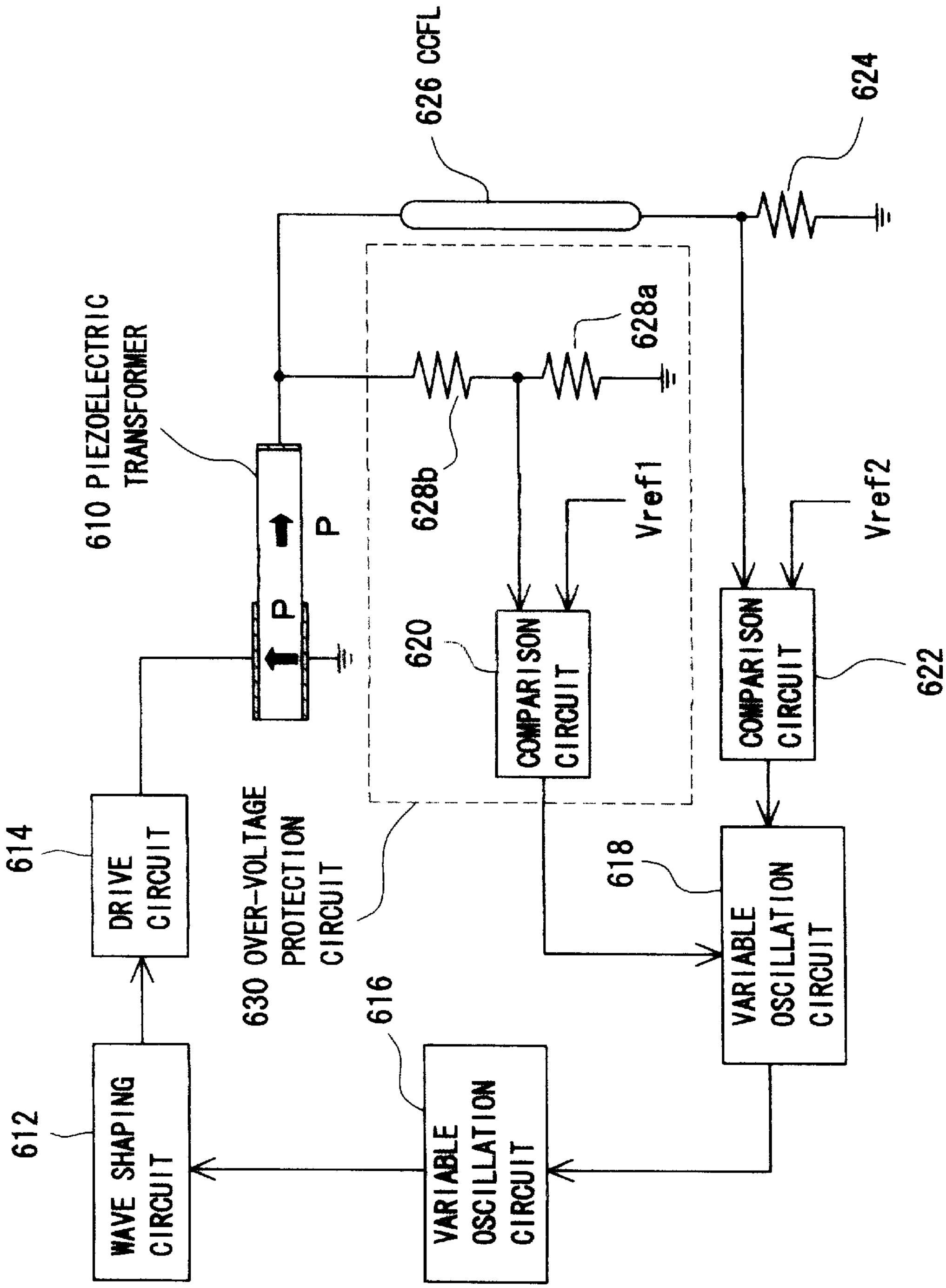
FIG. 27 is a block diagram of a prior art drive circuit for the piezoelectric transformer shown in FIG. 26.

FIG. 5 shows the connection of the conventional piezoelectric transformer 610 shown in FIG. 26 with a conventional CCFL 1126. This connection is described briefly below for comparison with the present invention.

As shown in FIG. 5, reference numeral 1150 is the ac source and reference numeral 1126 is the CCFL. AC source 1150 is connected to one primary electrode 514U, and the other primary electrode 514D is to ground. One terminal of the CCFL 1126 is connected to secondary side electrode 516, and the other terminal is to ground.

With the configuration shown in FIG. 51 a voltage output from output electrode 516 is applied to one end of the CCFL 1126 to strike the lamp.

Vsp is the striking potential for starting the CCFL 1126, and Vop is the operating voltage applied once the lamp is started.

The output voltage waves of the piezoelectric transformer when striking the CCFL using the piezoelectric transformer 610 shown in FIG. 26 and when using the piezoelectric transformer 110 shown in FIG. 2 according to the present invention are compared in FIG. 6.

Figure 6A:
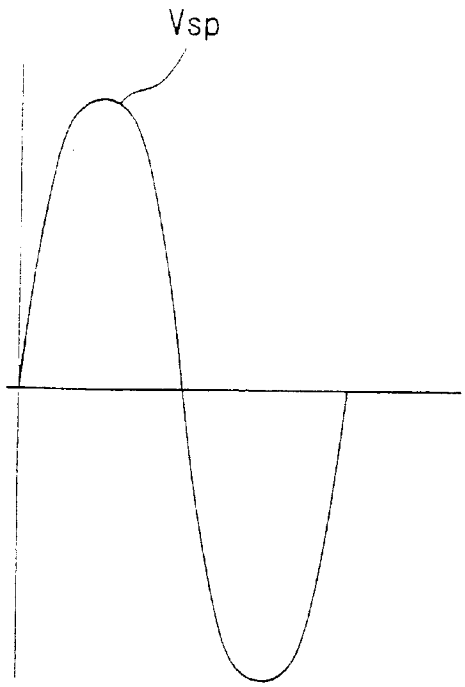
FIG. 6A shows the voltage waveform applied when striking a cold cathode fluorescent lamp connected to a piezoelectric transformer connected according to the prior art.
Figure 6C:
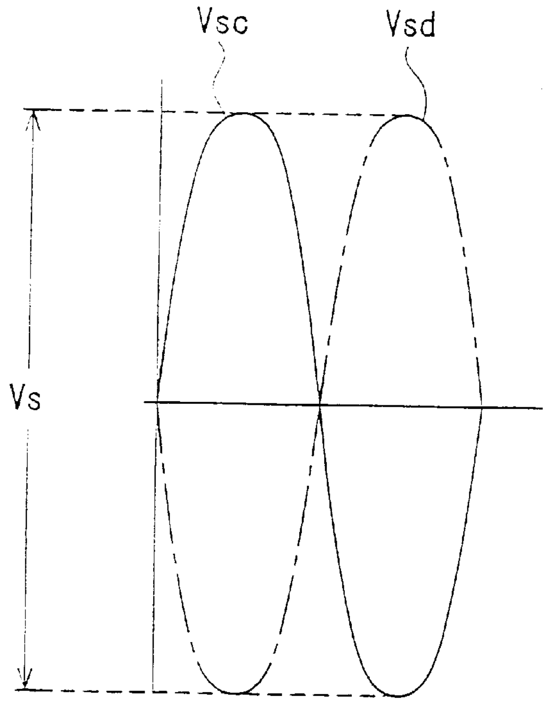
FIG. 6C shows the voltage waveform applied when operating a cold cathode fluorescent lamp connected to a piezoelectric transformer connected according to the prior art.

FIG. 6A shows the waveform of the voltage applied to strike a CCFL 1126 connected to a conventional piezoelectric transformer 610 as shown in FIG. 5, and FIG. 6C shows the waveform of the operating voltage.

Figure 6B:
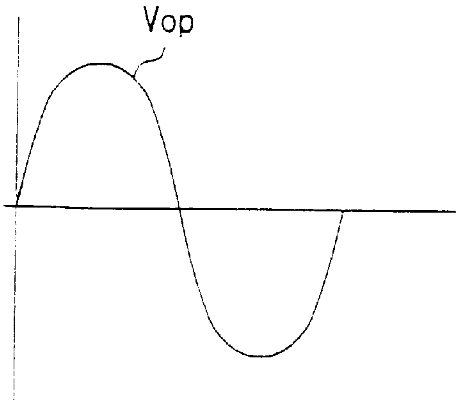
FIG. 6B shows the voltage waveform applied when striking a cold cathode fluorescent lamp connected to a piezoelectric transformer connected according to the present invention.
Figure 6D:
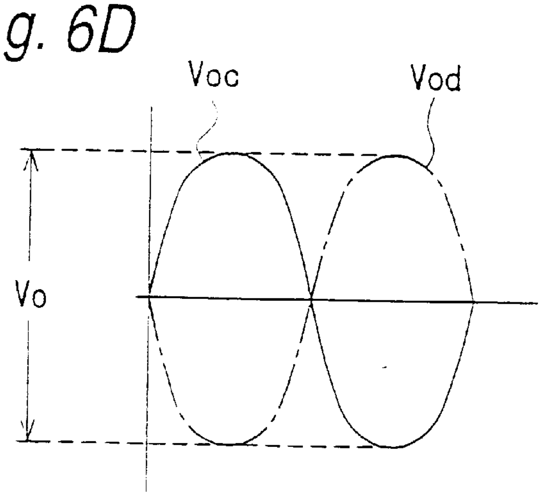
FIG. 6D shows the voltage waveform applied when operating a cold cathode fluorescent lamp connected according to the present invention.

FIG. 6B shows the waveform of the voltage applied to strike a CCFL 126 connected to a piezoelectric transformer 110 according to the present invention, and FIG. 6D shows the operating voltage waveform.

The solid lines in FIGS. 6B and 6D according to the present invention indicate Vsc and Voc, and the dot-dash lines indicate Vsd and Vod.

Striking the CCFL is described first.

As shown in FIG. 6A, the ground potential (0 V) is applied to one terminal and Vsp is applied to the other terminal of the CCFL 1126 to strike a single CCFL 1126 using a prior art piezoelectric transformer 610 with a conventional connection as shown in FIG. 5.

With a configuration using a piezoelectric transformer 110 according to the present invention, however, Vsc is applied to a terminal at one end of the CCFL 126 and Vsd is applied to a terminal at the other end of the CCFL 126 as shown in FIG. 6B. Note that the waveforms of Vsc and Vsd are equal amplitude but the phase differs 180°. The potential Vs required to strike a CCFL 126 having two series connected lamps 126*a* and 126*b* can thus be assured.

Operating the CCFL after it has started is described next.

To operate the conventionally connected single CCFL 1126 using a prior art piezoelectric transformer 610, the ground potential (0V) is applied to one electrical terminal and Vop is applied to the other terminal as shown in FIG. 6C.

With a configuration using a piezoelectric transformer 110 according to the present invention, however, Voc is applied to one end terminal of the CCFL 126 and Vod is applied to the other terminal as shown in FIG. 6D. Note that the waveforms of Voc and Vod are equal amplitude but the phase differs 180°. The potential Vo required to continue operating the CCFL 126 having two series connected lamps 126*a* and 126*b* can thus be assured.

It will thus be known that by driving a CCFL 126 using a piezoelectric transformer 110 according to the present invention the potential difference required to strike and operate the CCFL 126 can be assured at the ends of the CCFL 126, and the output voltage of the piezoelectric transformer 110 can be halved. That is, a voltage equal to the voltage required to drive a single CCFL 1126 with a prior art piezoelectric transformer 610 can be used to drive two CCFLs 126*a* and 126*b*. A CCFL 126 consisting of plural connected lamps such as shown in FIG. 4 can be driven by output from the piezoelectric transformer 110. The piezoelectric transformer 110 can therefore drive a CCFL 126 comprising plural lamps connected as shown in FIG. 4 by outputting a voltage that is half the required striking potential to each end of the CCFL 126. It will also be obvious that the same effect is achieved when driving a single CCFL.

With a drive device for a CCFL using a piezoelectric transformer 110 according to the present invention the CCFL 126 can be started by applying equal amplitude, 180° different phase voltages to both ends of the CCFL 126 using a single piezoelectric transformer 110. The invention thus has the advantage of reducing the size of the piezoelectric transformer drive circuit.

The striking voltage Vs applied to the ends of the CCFL 126 to start the CCFL can be denoted as follows.

$$Vs=(Vsc+Vsd)$$

The operating voltage Vo applied to CCFL 126 after it starts up can be denoted as follows.

$$Vo=(Voc+Vod)$$

where $$Vsc>Voc$$

$$Vsd>Vod.$$

This is because the output voltage of piezoelectric transformer 110 changes according to the load, is a relatively high voltage when striking the CCFL 126, and is a relatively low voltage when operating the CCFL 126.

A drive circuit for a CCFL using the piezoelectric transformer 110 shown in FIG. 2 is described next with reference to FIG. 1. FIG. 1 is a block diagram of a drive circuit for a CCFL using a piezoelectric transformer according to the present invention.

As shown in FIG. 1, drive circuit 130 drives the piezoelectric transformer 110 shown in FIG. 2, and is connected to drive power source 112. The drive circuit 130 is connected to primary electrode a 138 of piezoelectric transformer 110. The other primary electrode b 140 of piezoelectric transformer 110 goes to ground.

Drive control circuit 114 controls the drive circuit 130. CCFLs 126*a* and 126*b* are connected in series, forming CCFL 126. The electrical terminals at opposite ends of the CCFL 126 are connected to the secondary electrodes c 142 and d 144 of piezoelectric transformer 110. Voltage detector circuit 124 detects the secondary voltage of the piezoelectric transformer 110, and phase difference detector circuit 128 detects the phase difference between output from the drive circuit 130 and output from voltage detector circuit 124. Comparison circuit 120 compares phase difference detector circuit output with a specific reference voltage Vref. Phase control circuit 118 outputs a control signal to the drive control circuit 114 based on output from comparison circuit 120. Variable oscillation circuit 116 controls oscillation of the ac signal driving piezoelectric transformer 110, and startup control circuit 122 controls the variable oscillation circuit 116 until CCFL 126 starts up. Photodiode 119 detects CCFL 126 startup, and is connected to startup control circuit 122.

Operation of the piezoelectric transformer drive circuit thus comprised is described next below, starting with operation when the CCFL 126 starts up.

The startup control circuit 122 outputs a signal to variable oscillation circuit 116, which controls the drive frequency oscillation, while the CCFL 126 starts up.

Figure 10:
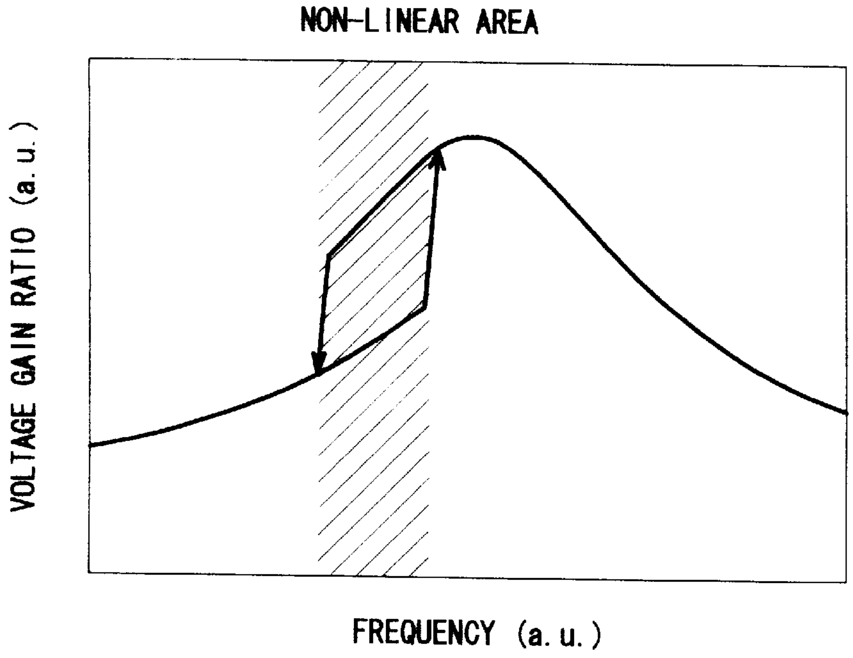
FIG. 10 shows the non-linear characteristic of the piezoelectric transformer.
Figure 11:
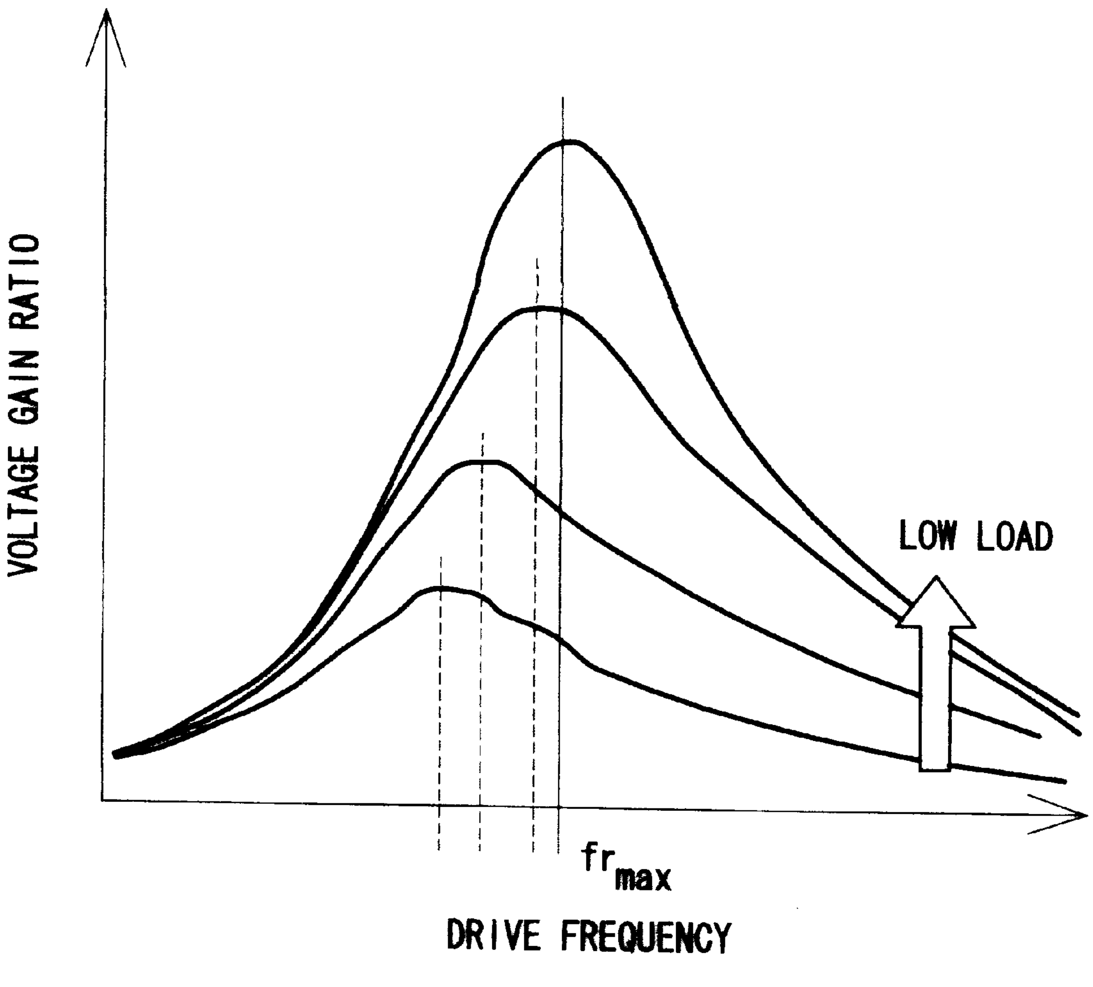
FIG. 11 shows the frequency characteristic of the step-up ratio to the load of the piezoelectric transformer.

The relationship between drive frequency and step-up ratio of the piezoelectric transformer 110 is shown in FIG. 11. As will be known from FIG. 11, the resonance frequency of the piezoelectric transformer 110 varies with the load, and the step-up ratio increases as the drive frequency approaches the resonance frequency. Using this characteristic of the piezoelectric transformer 110, the step-up ratio rises if the drive frequency is changed from a frequency higher than the resonance frequency to a frequency near the resonance frequency. The startup control circuit 122 thus controls the variable oscillation circuit 116 until the output voltage of the piezoelectric transformer 110 reaches the threshold voltage at which the CCFL 126 strikes. The variable oscillation circuit 116 changes the frequency of the ac drive signal according to the signal from startup control circuit 122. Note that when the ac drive signal frequency is changed by the variable oscillation circuit 116, the frequency is controlled to approach the resonance frequency from a frequency higher than the resonance frequency of the piezoelectric transformer 110. This is because the nonlinear hysteresis characteristic at frequencies below the resonance frequency as shown in FIG. 10 results in degraded characteristics.

Returning to FIG. 1, output from variable oscillation circuit 116 is input to drive control circuit 114. Drive control circuit 114 outputs a drive control signal to drive circuit 130 based on the ac drive signal output from variable oscillation circuit 116. Using power source 112, the drive circuit 130 amplifies this drive control signal to a level required for the CCFL 126 to start up, and applies the amplified drive control signal to electrode a 138. The input drive control signal, that is, voltage, is stepped up by the piezoelectric effect and output as a high potential from electrode c 142 and electrode d 144. The high potential output from electrode c 142 and electrode d 144 is applied to the CCFL 126 comprising two series connected lamps 126*a* and 126*b*, thus striking the CCFL 126. When the CCFL 126 strikes, CCFL startup is detected from the brightness detected by photodiode 119, for example, and startup control circuit 122 stops operating. The variable oscillation circuit 116 also fixes the frequency of the ac drive signal.

Operation of the piezoelectric transformer drive circuit to operate the CCFL 126 once the CCFL 126 is on is described next.

The ac drive signal fixed by the variable oscillation circuit 116 when the CCFL 126 strikes is output to the drive control circuit 114 at the fixed frequency. The drive control circuit 114 reduces signal components other than the piezoelectric transformer drive frequency, and outputs the desired drive control signal to drive circuit 130. The drive circuit 130 uses the power source 112 to amplify the drive control signal from the drive control circuit 114 to a level sufficient to drive piezoelectric transformer 110, and applies the amplified signal to the primary electrode a 138 of piezoelectric transformer 110 as the ac input signal. The ac signal input to electrode a 138 is then output as a result of the piezoelectric effect as a high potential from the secondary electrode c 142 and electrode d 144. The high voltage from the secondary electrodes is then applied to CCFL 126. Note that the high voltage signals applied to the two electrodes of the CCFL 126 have the same frequency but 180° different phase.

Figure 7:
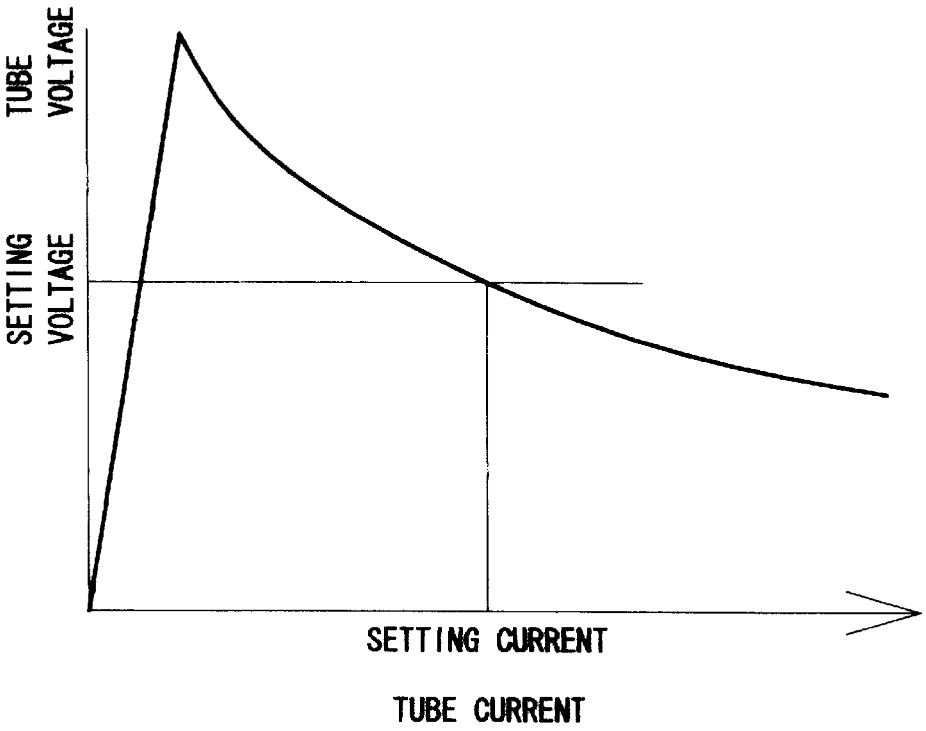
FIG. 7 shows the current and voltage characteristics of the cold cathode fluorescent lamp according to the present invention.
Figure 8:
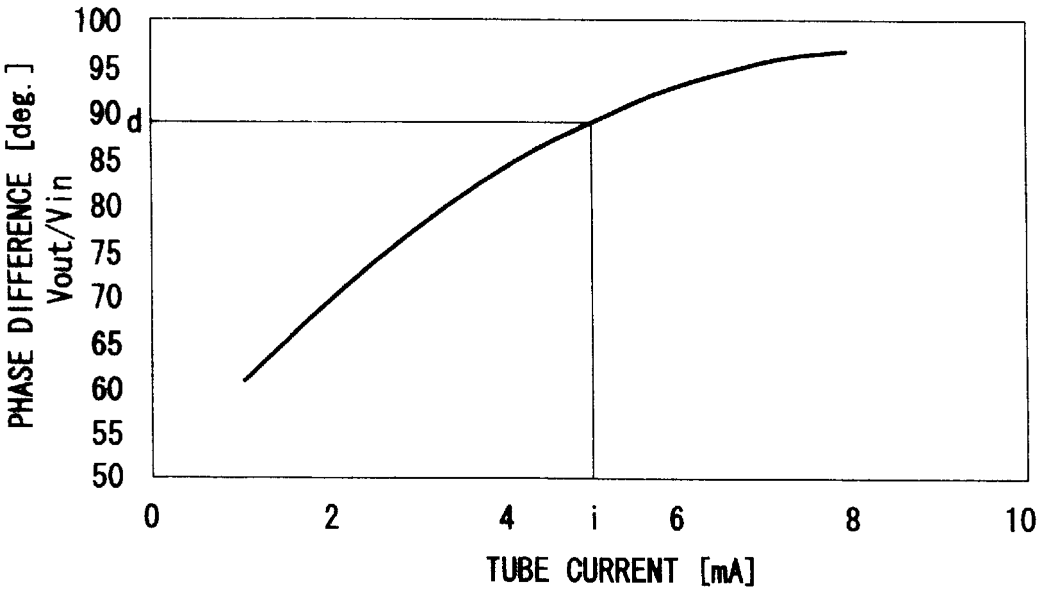
FIG. 8 shows the relationship between current flow in the CCFL and input/output voltage phase difference of the piezoelectric transformer shown in FIG. 2.

The voltage-current characteristic of this CCFL 126 is shown in FIG. 7 and the results of measuring the input-output voltage phase difference of the piezoelectric transformer 110 and current flow to the CCFL 126 are shown in FIG. 8. The relationship between the tube current and the input/output voltage phase difference of the piezoelectric transformer 110 is shown in FIG. 8 with the current flow to the CCFL 126 on the x-axis and the phase difference of the input/output voltages of piezoelectric transformer 110 on the y-axis.

Figure 9:
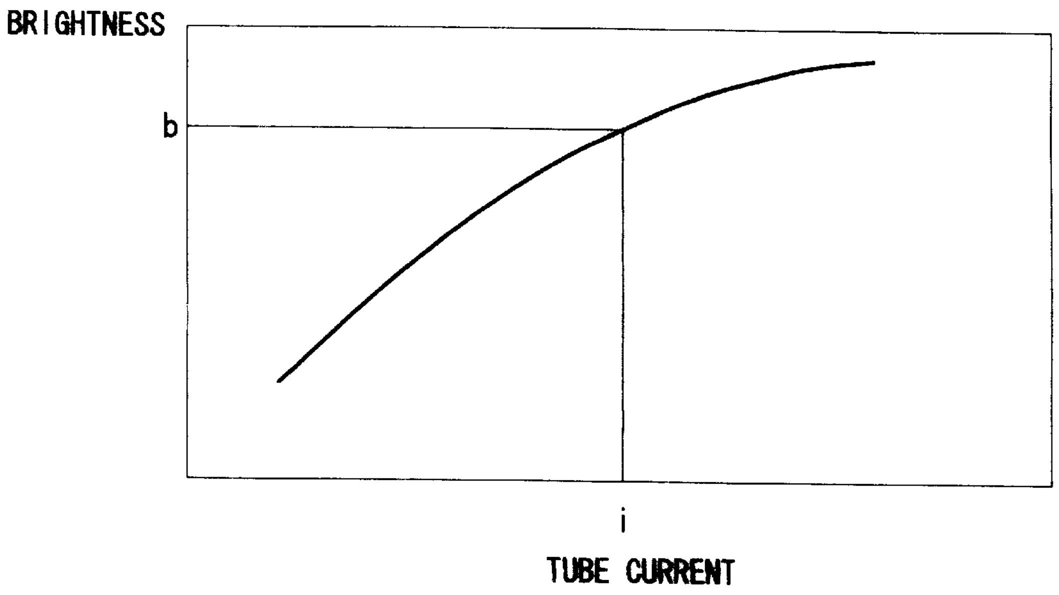
FIG. 9 shows the relationship between current flow in the CCFL and CCFL brightness with the piezoelectric transformer shown in FIG. 2.

As shown in FIG. 7, the CCFL 126 has a negative resistance characteristic, that is, as current increases voltage decreases. Impedance thus varies according to the current flow to the CCFL 126. On the other hand, FIG. 8 shows the relationship between current flow to CCFL 126 and the input/output voltage phase difference of the piezoelectric transformer 110. Note that piezoelectric transformer 110 is driven at a single frequency. FIG. 8 shows that if the piezoelectric transformer drive frequency is fixed, the phase difference between the input/output voltages of the piezoelectric transformer 110 increases as CCFL 126 current flow increases (tube impedance decreases). On the other hand, the resonance frequency of piezoelectric transformer 110 varies with load and drive frequency. In this embodiment of the invention, therefore, the piezoelectric transformer 110 drive frequency is fixed, the phase difference in the input/output voltages is detected as the load changes, and this phase difference is held constant to control a constant current flow to the CCFL 126. The phase difference between the input/output voltages of the piezoelectric transformer 110 must be detected in order to accomplish this. In FIG. 8 "i" is the CCFL 126 current setting, and "d" is the input/output voltage phase difference of the piezoelectric transformer 110. FIG. 9 shows the relationship between current flow to CCFL 126 and CCFL 126 brightness. Current flow to the CCFL 126 is shown on the x-axis, and CCFL brightness is on the y-axis. It will be known from FIG. 9 that CCFL 126 brightness increases as CCFL current flow increases.

If CCFL brightness is below level b, current flow in CCFL 126 is below current setting "i" as shown in FIG. 9. In other words, in FIG. 8 the detected phase difference is less than phase difference d. To bring the detected phase difference to the phase difference setting d, it is sufficient to increase power input to piezoelectric transformer 110. If CCFL 126 brightness is greater than level b, current flow in CCFL 126 is greater than the current setting "i". In this case, power input to the piezoelectric transformer 110 is reduced because the detected phase difference is greater than phase difference d.

It is thus possible to maintain a constant current flow in CCFL 126 by detecting the phase difference of the input/output voltages of piezoelectric transformer 110, and comparing this phase difference with the set voltage phase difference.

Returning again to FIG. 1, the high voltage applied to CCFL 126 is also input to voltage detector circuit 124. The voltage detector circuit 124 converts the sinusoidal output voltage of the piezoelectric transformer 110 to a rectangular ac output signal of a desired level, and outputs to phase difference detector circuit 128. The phase difference detector circuit 128 detects the phase difference between the ac output signal from voltage detector circuit 124 and the ac input signal of the piezoelectric transformer 110. After conversion to a dc voltage corresponding to the phase difference, the phase difference detector circuit 128 outputs to comparison circuit 120. The comparison circuit 120 outputs to the phase control circuit 118 so that the output from phase difference detector circuit 128 becomes equal to reference voltage Vref. Note that Vref is a preset dc voltage corresponding to phase difference d. The phase control circuit 118 controls drive control circuit 114 according to output from comparison circuit 120, and determines power input to the piezoelectric transformer 110.

Figure 20:
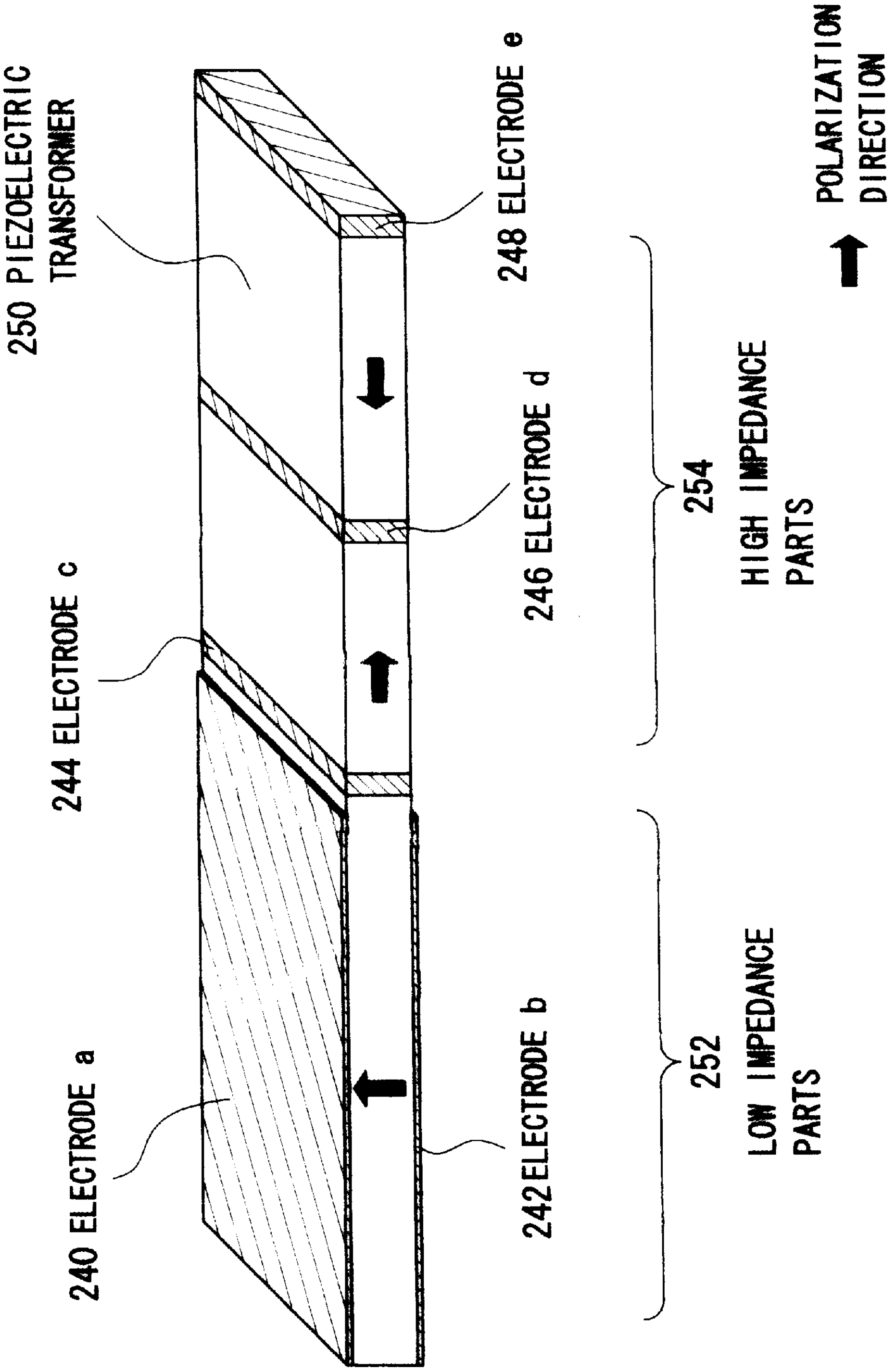
FIG. 20 is an oblique view of a piezoelectric transformer according to the prior art.
Figure 21:
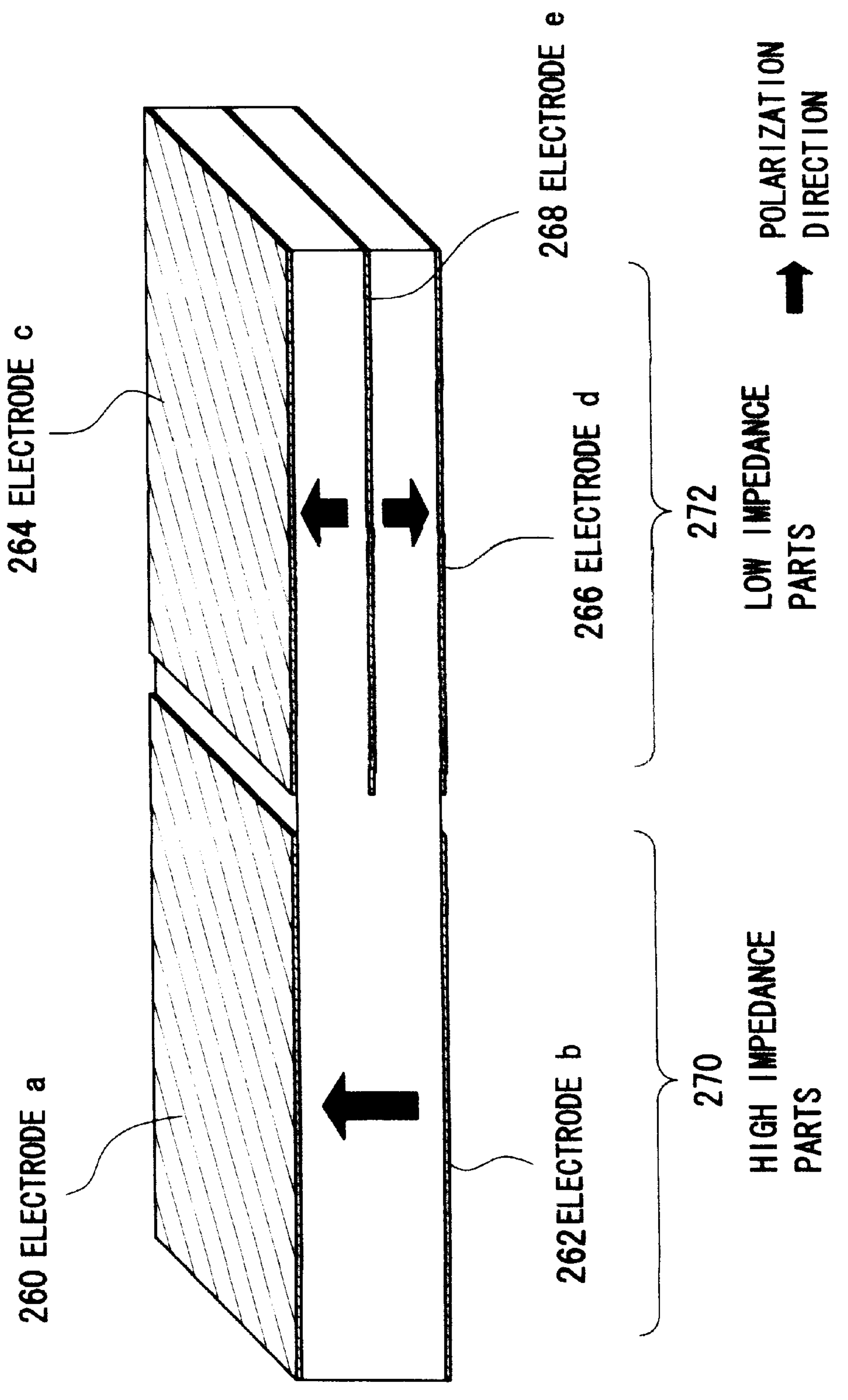
FIG. 21 is an oblique view of a piezoelectric transformer according to another example of the prior art.
Figure 22:
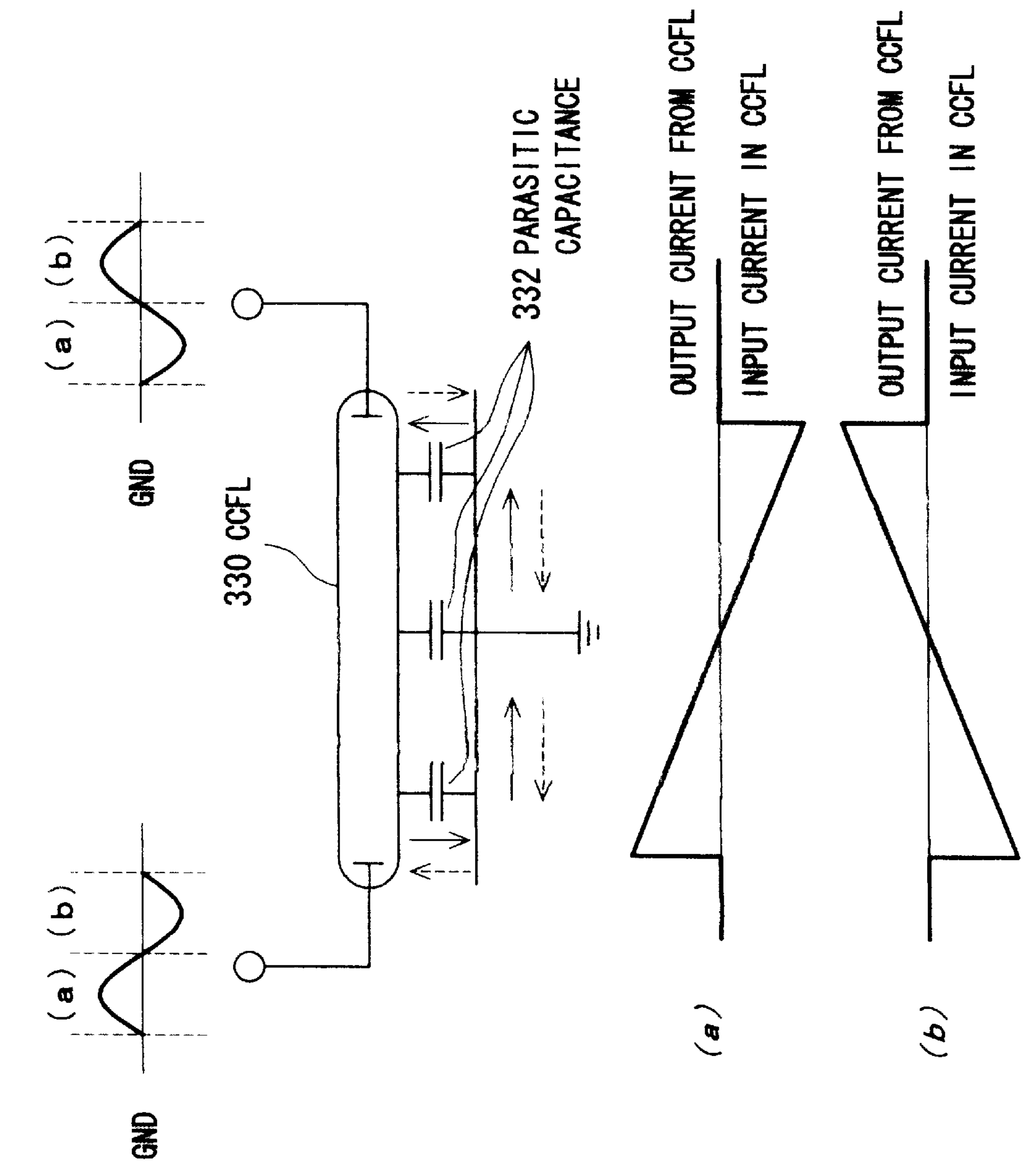
FIG. 22 describes CCFL leakage current.
Figure 23:
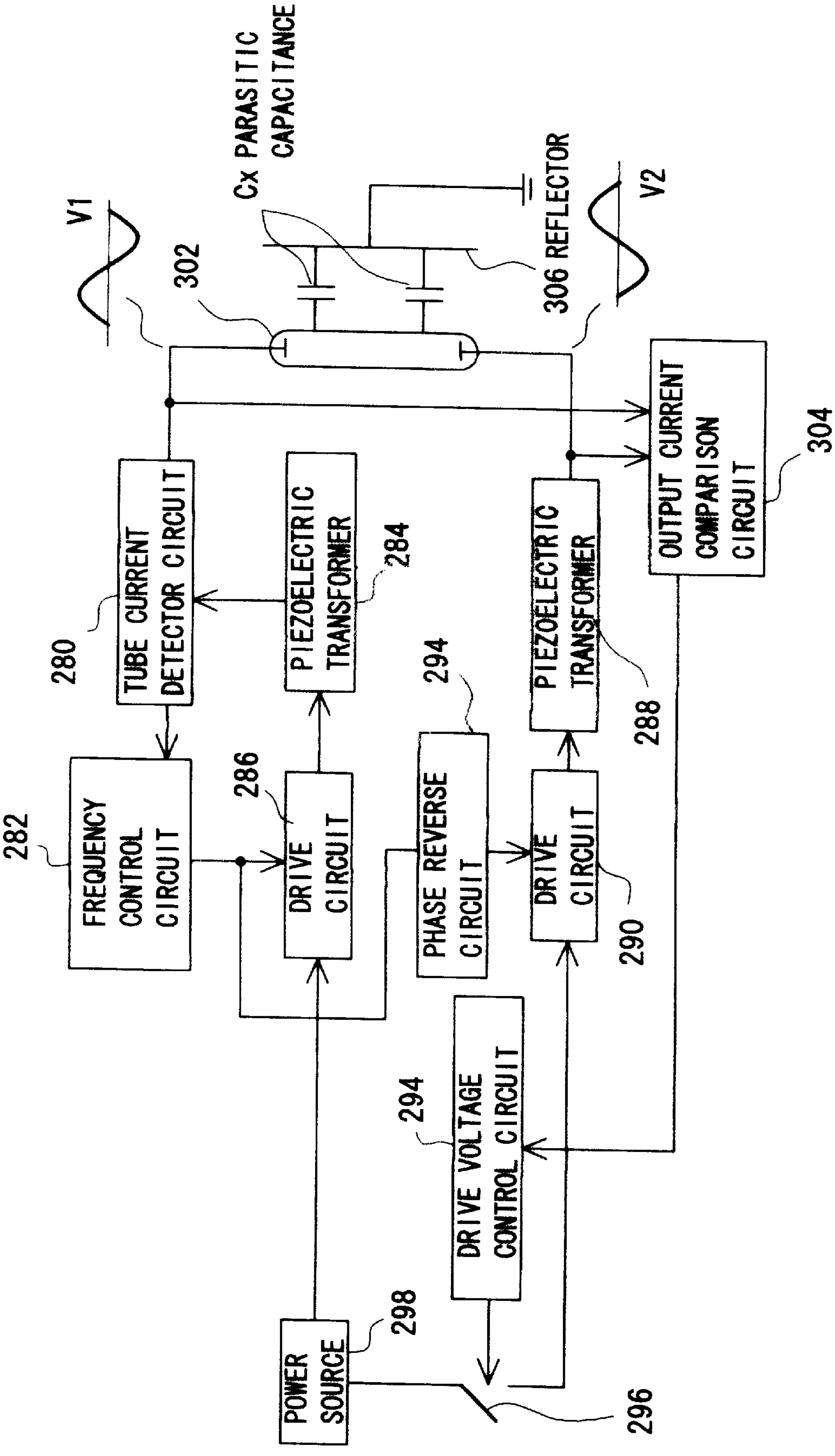
FIG. 23 is a block diagram of a drive circuit disclosed in Japanese Laid-Open Patent Publication No. 11-8087.
Figure 24:
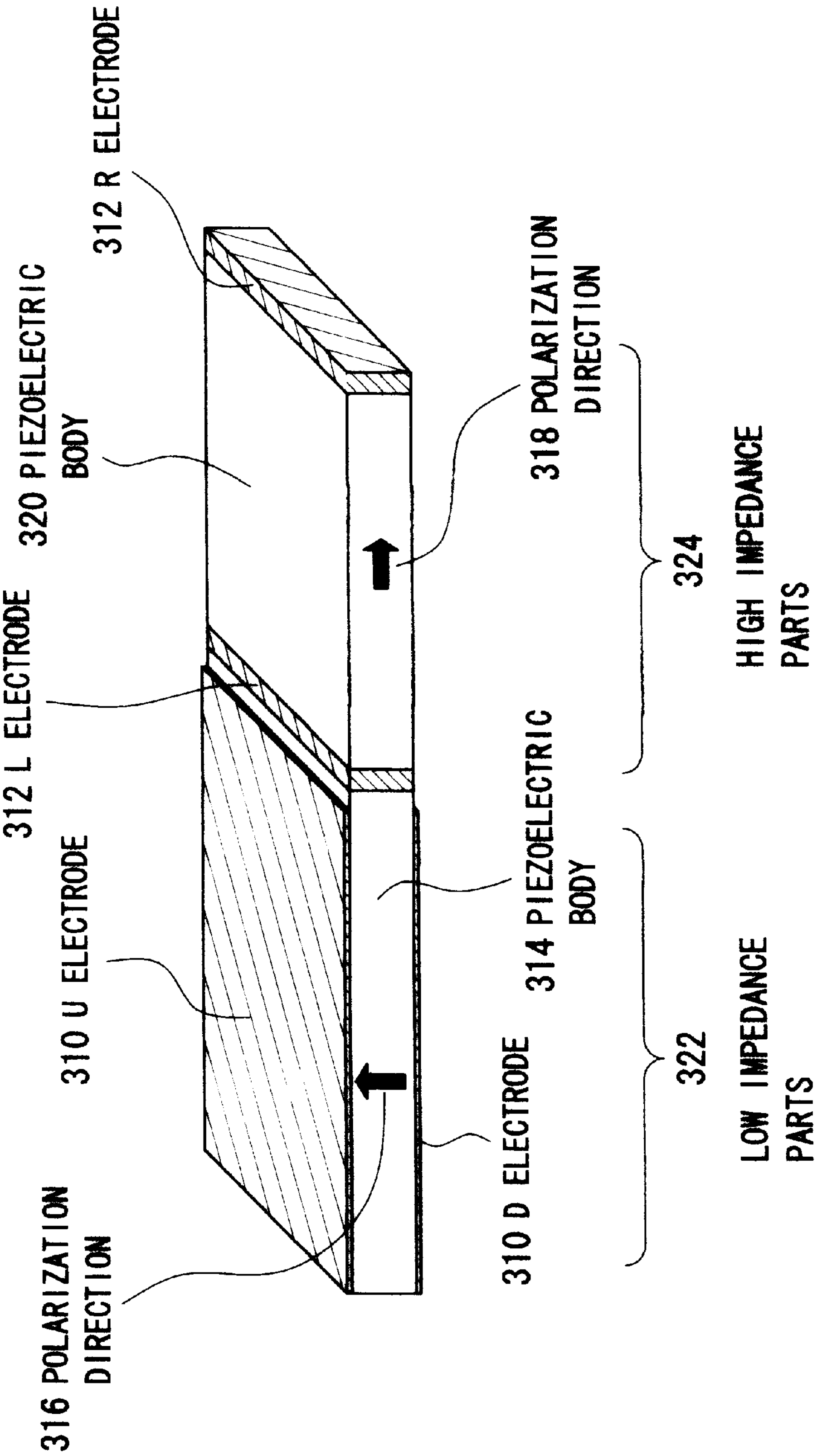
FIG. 24 is an oblique view of a piezoelectric transformer according to another example of the prior art.
Figure 25:
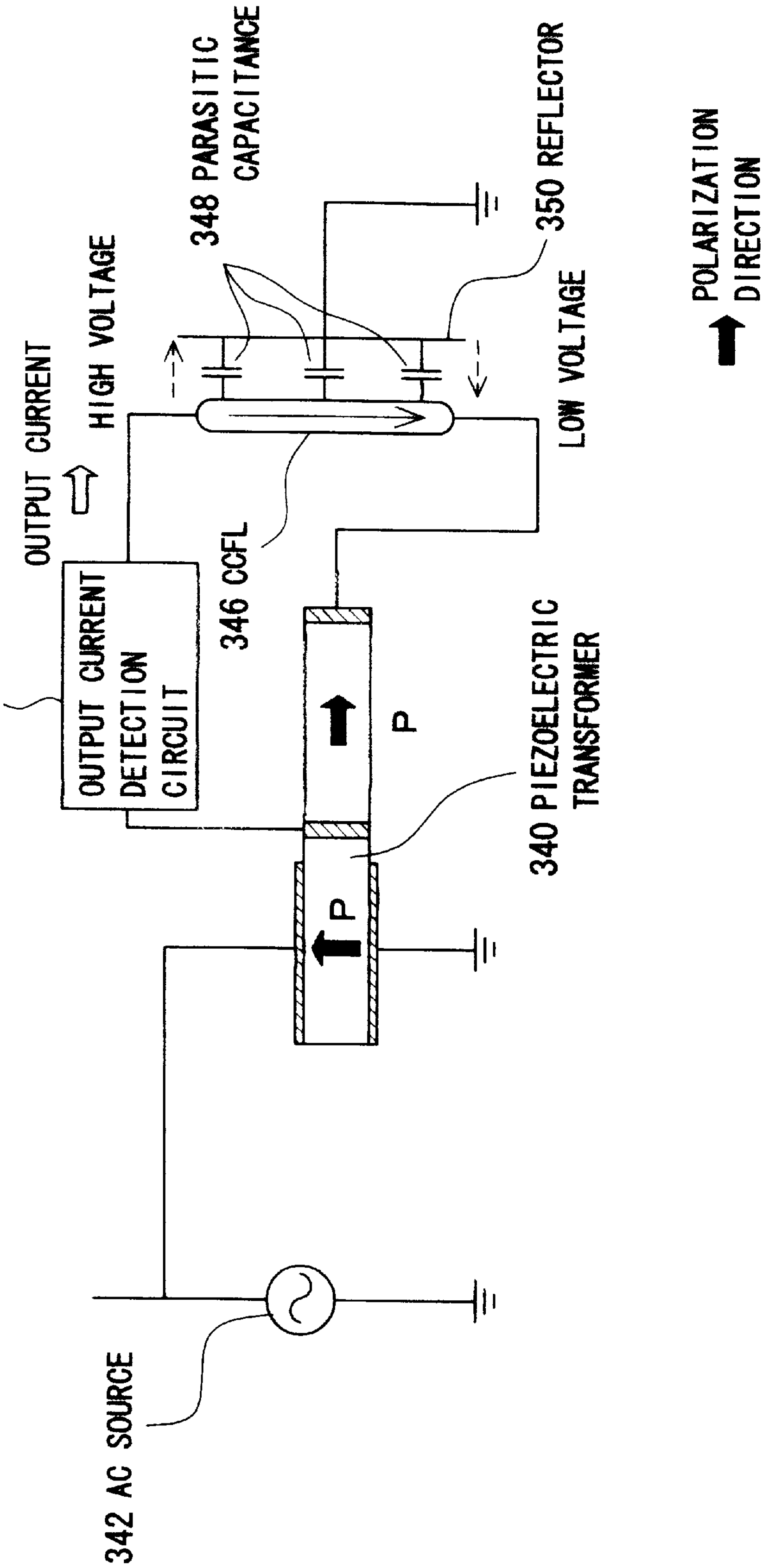
FIG. 25 is a block diagram showing the drive method of the piezoelectric transformer shown in FIG. 23.

It should be noted that while a center drive type piezoelectric transformer as shown in FIG. 2 is used as the piezoelectric transformer in the preferred embodiment described above, the same effect can be achieved with various other configurations, such as shown in FIG. 20 and FIG. 21, insofar as the piezoelectric transformer has two secondary electrodes and outputs 180° different phase voltages from the two electrodes.

Figure 12:
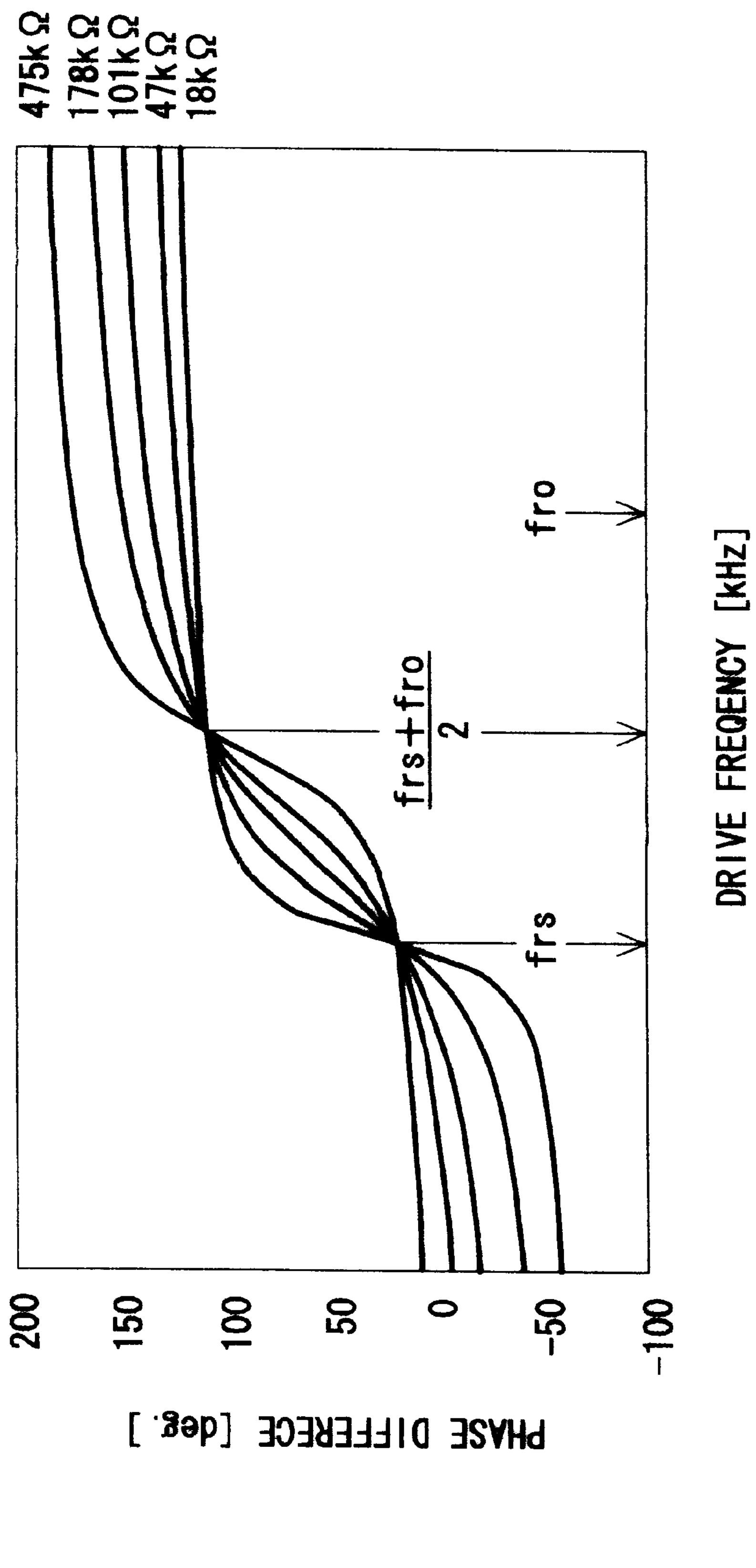
FIG. 12 shows the frequency characteristic of the input/output voltage phase difference to the load of the piezoelectric transformer.

The relationship between piezoelectric transformer drive frequency and input/output voltage phase difference is shown in FIG. 12. In FIG. 12 fro is the resonance frequency when the secondary side of piezoelectric transformer 110 is open, and frs is the resonance frequency when the secondary side is shorted. Note that there is no phase change at (frs+fro)/2 and frs, and the input/output voltage phase difference therefore cannot be controlled. The piezoelectric transformer must therefore be driven at a drive frequency other than (frs+fro)/2 and frs.

Furthermore, the phase change due to load change is small at frequencies near where there is zero phase change. More specifically, if the piezoelectric transformer is driven at a frequency in the range frs or (frs+fro)/2±0.3 kHz, operational errors may occur as a result of the small phase change. It is therefore preferable to drive the piezoelectric transformer at a frequency outside this frequency band.

Embodiment 2

Figure 13:
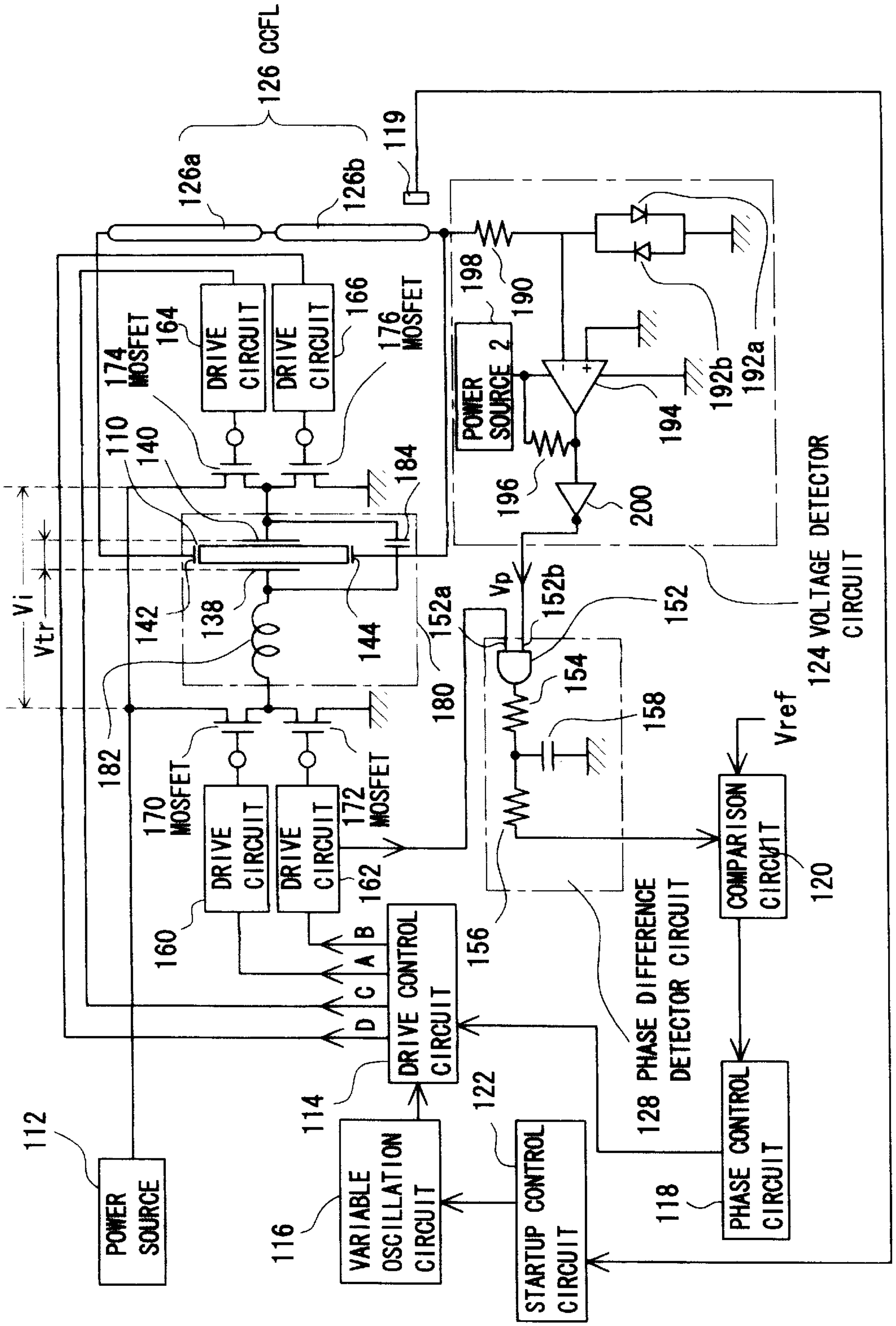
FIG. 13 is a block diagram of a second embodiment of the invention.
Figure 14:
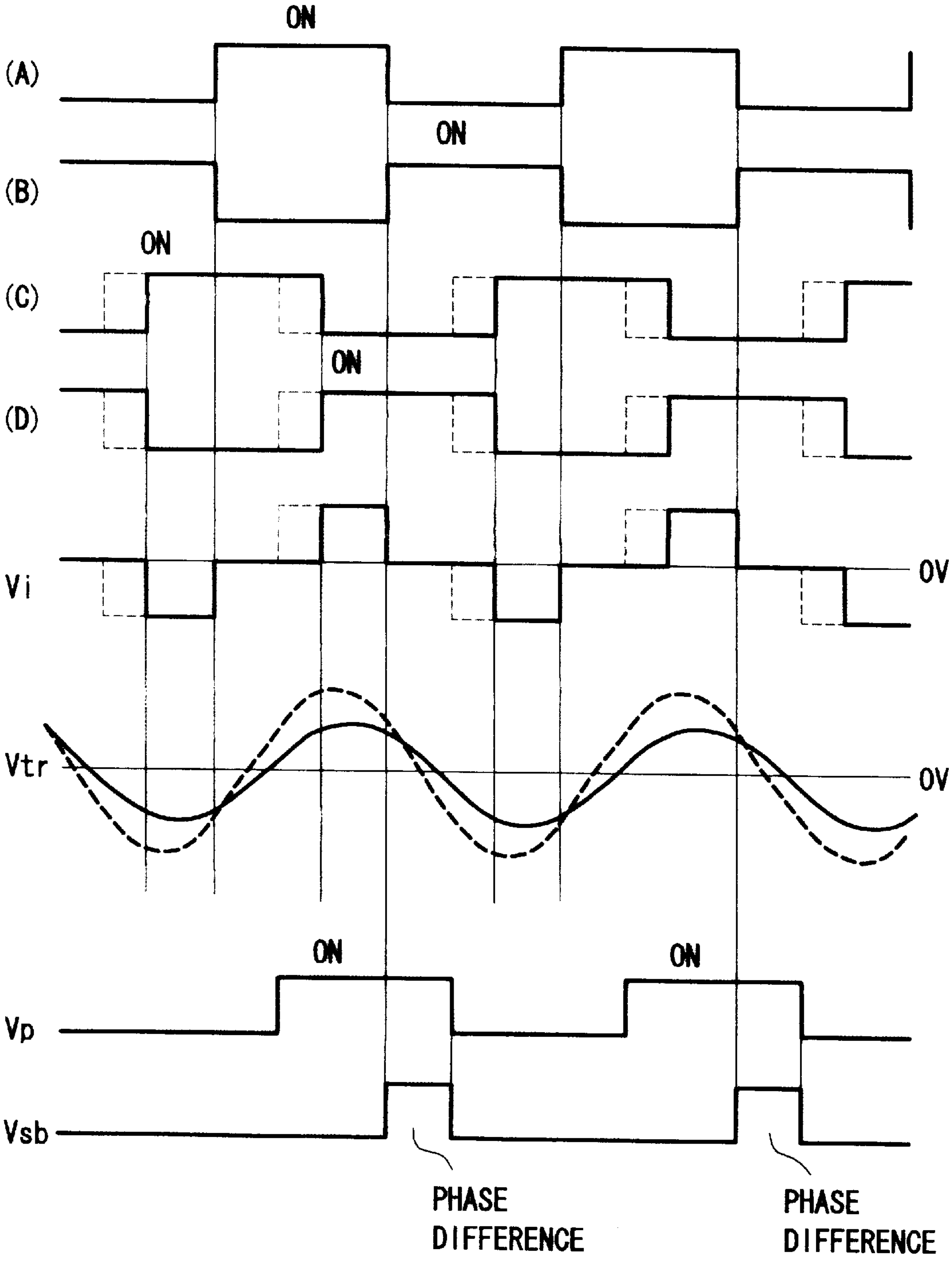
FIG. 14 shows the signal waveforms from the drive circuit, resonance circuit, voltage detector circuit, and phase difference control circuit shown in FIG. 13.

FIG. 13 is a block diagram of a drive circuit for a CCFL according to a second preferred embodiment of the present invention. FIG. 14 shows the MOSFET switching signals in this embodiment. Note that the configuration and operation of the piezoelectric transformer 110 in this embodiment are the same as in the first embodiment.

Referring to FIG. 13, variable oscillation circuit 116 generates the ac signal for driving piezoelectric transformer 110. MOSFETs 170, 172, 174, and 176 are switching elements for forming the piezoelectric transformer drive signal. Drive circuits 160, 162, 164, and 166 drive MOSFETs 170, 172, 174, and 176, respectively, and are connected to the respective MOSFET gate. A first series connecting the source of switching circuit MOSFET 170 and the drain of MOSFET 172 is connected to power source 112, and a second series connecting the source of MOSFET 174 and the drain of MOSFET 176 is also connected to power source 112. A resonant circuit 180 consisting of 182, the piezoelectric transformer 110 input capacitance, and capacitor 184 is connected between the node of first series switch MOSFETs 170 and 172, and the node of second series switch MOSFETs 174 and 176. The four MOSFETs 170, 172, 174, and 176 are thus connected in an H bridge configuration to the power source 112.

The inductance 182 and piezoelectric transformer 110 are connected in series through electrode a 138, forming a third series. The capacitor 184 and piezoelectric transformer 110 are connected in series with primary electrode a 138 and electrode b 140. A fourth series of the two series connected lamps 126*a* and 126*b* is connected with the electrical terminals thereof connected to the secondary electrodes c 142 and d 144 of the piezoelectric transformer. This fourth connection series is referred to as CCFL 126 below.

The voltage detector circuit 124 for detecting the high potential output from secondary electrodes of piezoelectric transformer 110 is connected to electrode d 144. This voltage detector circuit 124 comprises a first resistance 190, diode unit 192 having first diode 192*a* and second diode 192*b* parallel connected in opposite orientation, comparator 194, second resistance 196, second power source 198, and inverter IC 200. The first resistance 190 is connected to electrode d 144 of piezoelectric transformer 110, and to ground. First resistance 190 is also connected in series with diode connection 192, forming a fifth connection series. The inverting input of comparator 194 is connected to the node between first resistance 190 and diode connection 192. The non-inverting input of comparator 194 is to ground. The output of comparator 194 is connected to inverter IC 200 and second resistance 196. The comparator 194 is also connected to second power source 198, and is thereby grounded. The second resistance 196 is also connected to second power source 198.

Voltage phase difference detector circuit 128 detects the input/output voltage phase difference of the piezoelectric transformer 110 by means of AND 152, a third resistance 154, fourth resistance 156, and second capacitor 158. Drive circuit 162 is connected to first input 152*a* of AND 152, and the output of inverter IC 200, that is, the output of voltage detector circuit 124, is connected to second input 152*b* of AND 152.

The comparison circuit 120 compares output from phase difference detector circuit 128 with specific reference voltage Vref. Phase control circuit 118 outputs a control signal to the drive control circuit 114 based on output from comparison circuit 120. Variable oscillation circuit 116 controls oscillation of the ac signal driving piezoelectric transformer 110, and startup control circuit 122 controls the variable oscillation circuit 116 until CCFL 126 starts up. Photodiode 119 detects CCFL 126 startup, and is connected to startup control circuit 122.

Operation of the piezoelectric transformer drive circuit thus comprised is described next below, starting with operation when the CCFL 126 starts up.

The startup control circuit 122 outputs an ac drive signal to variable oscillation circuit 116, which controls the drive frequency oscillation, while the CCFL 126 starts up.

As in the first embodiment, the startup control circuit 122 controls the variable oscillation circuit 116 until the output voltage of the piezoelectric transformer 110 reaches the threshold voltage at which the CCFL 126 strikes. The variable oscillation circuit 116 changes the frequency of the ac drive signal according to the signal from startup control circuit 122. Based on the ac drive signal from variable oscillation circuit 116, drive control circuit 114 outputs the drive control signals controlling drive circuits 160, 162, 164, 166. MOSFETs 170, 172, 174, and 176 switch according to the drive control signals from drive circuits 160, 162, 164, 166, and determine the voltage of the rectangular signal, that is, the ac input signal, applied to both sides of resonant circuit 180. The frequency of this ac input signal is set to approximately the resonance frequency of resonant circuit 180. A sinusoidal voltage wave is thus applied between electrode a 138 and electrode b 140.

The input drive control signal, that is, voltage, is stepped up by the piezoelectric effect, and output as a high potential from electrode c 142 and electrode d 144. The high potential output from electrode c 142 and electrode d 144 is applied to the CCFL 126, which thus strikes. When the CCFL 126 strikes, CCFL startup is detected from the brightness detected by photodiode 119, for example, and startup control circuit 122 stops operating. The variable oscillation circuit 116 also fixes the frequency of the ac drive signal at this time.

Operation of the piezoelectric transformer drive circuit once the CCFL 126 is on is described next.

The ac drive signal fixed by the variable oscillation circuit 116 when the CCFL 126 strikes is output to the drive control circuit 114 at the fixed frequency. The drive control circuit 114 outputs drive control signals A, B, C, D to drive circuits 160, 162, 164, 166, respectively. Control signals A, B, C, D switch MOSFETs 170, 172, 174, and 176 on and off.

Controlling input power to piezoelectric transformer 110 is described next with reference to FIG. 14.

FIG. 14(A) shows the waveform of drive control signal A output from drive control circuit 114. The corresponding waveforms for control signals B, C, D from drive control circuit 114 are shown in FIGS. 14(B), (C), (D). The frequency of control signals A, B, C, D is the frequency of the ac drive signal fixed when the CCFL 126 started up. FIG. 14 (Vi) is the waveform applied to the sides of resonant circuit 180 in FIG. 13, and Vtr is the waveform applied to the primary electrodes of the piezoelectric transformer 110. Vp is the output signal waveform from voltage detector circuit 124, and Vsb shows the phase difference between the waveform in FIG. 14(B) and voltage detector circuit output signal Vp.

As indicated by FIGS. 14(A) and (B), drive control signals A and B are set to switch on and off at a specific on time ratio (duty cycle). Control signals C and D are set to switch on and off with the on time ratio as signals A and B but also with a specific phase difference from signals A and B as shown in FIGS. 14(C) and (D). The waveforms shown by the solid lines in FIGS. 14(C) and (D) indicate when CCFL 126 brightness is constrained or the input voltage is high. The waveform of the ac input signal applied to both sides of resonant circuit 180 at this time is indicated by the solid line in waveform Vi. Note that the waveform of the voltage applied to the primary electrodes of piezoelectric transformer 110 is sinusoidal as shown by Vtr in FIG. 14 because the frequency of the rectangular signal Vi is set near the resonance frequency fr of resonant circuit 180. The piezoelectric transformer 110 resonance frequency fr can be denoted as follows where L is the inductance of inductor 182, Cp is the input capacitance of piezoelectric transformer 110, and C is the capacitance of capacitor 184.

$$f_r = \frac{1}{2\pi\sqrt{L(Cp+C)}}$$

In contrast to the solid line waveform, the dotted line waveform in FIG. 14 shows the signal applied to the resonant circuit 180 when CCFL 126 brightness is high or the input voltage is low. The ac input signal applied to resonant circuit 180 at this time is likewise indicated by the dotted line Vi. The waveform of the voltage applied between the primary electrodes of piezoelectric transformer 110 is still a sinusoidal waveform Vtr as shown in FIG. 14. In other words, power input to piezoelectric transformer 110 can be controlled with the drive frequency fixed by controlling the phase difference between drive control signals A, B, C, and D as described above.

The voltages applied to electrode a 138 and electrode b 140 of piezoelectric transformer 110 as a result of this control method are output by the piezoelectric effect as a high potential from the secondary electrodes c 142 and d 144. The high potential output from the secondary electrodes is applied to the fourth series connection, that is, series connected lamps 126*a* and 126*b*. Note that a high voltage of the same frequency and 180° different phase is applied to the two electrical terminals of the four series connection. The voltage occurring at the secondary electrodes of the piezoelectric transformer 110 is also input to voltage detector circuit 124.

As in the first embodiment, the drive frequency of the piezoelectric transformer 110 is fixed, the phase difference of the input/output voltages to changes in load is detected, and current flow to the CCFL 126 is controlled so as to keep this phase difference constant. The phase difference between the input/output voltages of the piezoelectric transformer 110 must be detected in order to accomplish this. This is further described below.

Referring to FIG. 13, voltage detector circuit 124 detects the high potential output from the secondary electrodes of piezoelectric transformer 110. This high voltage input from the secondary electrodes of piezoelectric transformer 110 is lowered by diode connection 192 to a level that can be input to comparator 194, specifically to the non-inverting input of comparator 194.

In the first and second embodiments of the invention the ac output signal of the piezoelectric transformer 110 must be detected with good precision in order to detect the input/output voltage phase difference of the piezoelectric transformer 110. How this is accomplished is described with reference to FIG. 15.

Figure 15B:
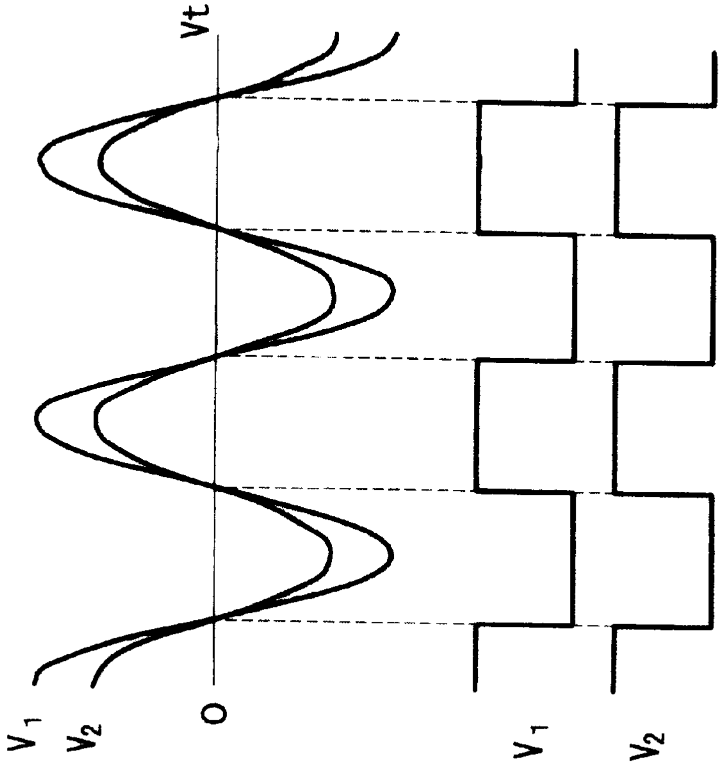
FIGS. 15A and 15B show the operation of the voltage detector circuit shown in FIG. 13.

FIG. 15 shows the change in output from voltage detector circuit 124 when detecting the output voltage of piezoelectric transformer 110.

Figure 15A:
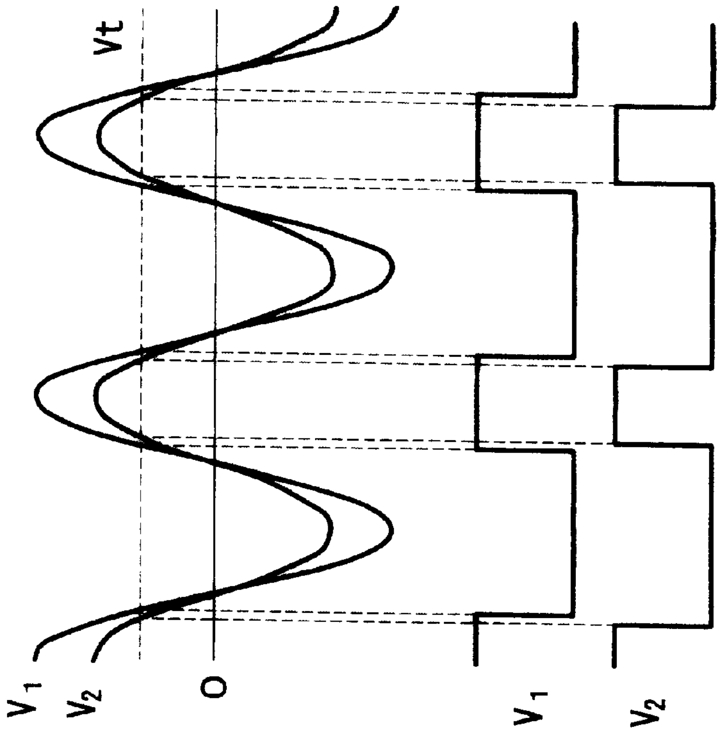

As shown in FIG. 15A, if the threshold voltage Vt is not 0 V when converting the ac signal from piezoelectric transformer 110 to a rectangular wave of a desired voltage amplitude, the time ratio of the voltage detector circuit 124 changes according to the amplitude level of the piezoelectric transformer 110 output voltage. When the threshold voltage Vt is 0 V as shown in FIG. 15(*b*), however, a rectangular wave with the same time ratio can be output irrespective of the vibration amplitude of the piezoelectric transformer. As a result, the non-inverting input of the comparator 194 in voltage detector circuit 124 goes to ground as shown in FIG. 13. This makes it possible to take the threshold voltage to 0 V.

Returning to FIG. 13, the signal output from comparator 194 thus configured has the phase inverted 180° and is input to inverter IC 200. The inverter IC 200 converts the phase-inverted signal output from comparator 194 to a rectangular ac output signal of the same phase but different voltage level as the ac output voltage from piezoelectric transformer 110. The ac output signal converted by inverter IC 200 is input to phase difference detector circuit 128 as the output from voltage detector circuit 124. This signal is shown as waveform Vp in FIG. 14.

The phase difference detector circuit 128 detects the phase difference between the ac output signal from voltage detector circuit 124 and the drive switching signal of MOSFET 172, and produces a dc voltage corresponding to the phase difference. The MOSFET 172 switching signal is also input to the first input 152*a* of AND 152 in phase difference detector circuit 128, and the ac output signal from voltage detector circuit 124 is applied to the second input 152*b*. The AND 152 outputs the AND phase difference signal obtained from the two inputs. The AND 152 thus produces a phase difference signal indicating the phase difference between the MOSFET 172 switching signal and the ac output signal from voltage detector circuit 124. The waveform of this phase difference signal is shown as Vsb in FIG. 14.

Using second capacitor 158, third resistance 154, and fourth resistance 156, the phase difference detector circuit 128 obtains the average of the phase difference shown as Vsb in FIG. 14 and output from AND 152, and outputs the result as a dc voltage to comparison circuit 120. The comparison circuit 120 outputs a signal to the phase control circuit 118 so that phase difference detector circuit 128 output and reference voltage Vref become equal. Note that reference voltage Vref is a dc voltage corresponding to a predefined phase difference. The phase control circuit 118 controls drive control circuit 114 according to output from comparison circuit 120, and thus determines the input to piezoelectric transformer 110.

By thus driving and controlling the piezoelectric transformer, the piezoelectric transformer can be driven at a single frequency when striking the CCFL, and CCFL brightness can be held constant.

It should be noted that while the phase difference between the switching signal applied to the MOSFET gates and the output voltage of the piezoelectric transformer is detected in this embodiment of the invention, other configurations can be used to achieve the same effect insofar as there is a phase detection circuit.

Furthermore, the voltage detector circuit for detecting the piezoelectric transformer output voltage comprises resistors, diodes, comparator, and an inverter IC, and the piezoelectric transformer input voltage is determined using FET switching signals in order, in order to detect the phase difference in this preferred embodiment of the invention, but the same effect can be achieved using other methods insofar as the phase difference can be detected.

It should be noted that when the piezoelectric transformer is driven at a frequency below the resonance frequency it exhibits a non-linear hysteresis characteristic as shown in FIG. 10 that degrades performance. It is therefore desirable to fix the drive frequency at a frequency higher than the piezoelectric transformer resonance frequency at which the CCFL current is lowest (FIG. 11).

The relationship between piezoelectric transformer drive frequency and input/output voltage phase difference is shown in FIG. 12. In FIG. 12 fro is the resonance frequency when the secondary side of piezoelectric transformer 110 is open, and frs is the resonance frequency when the secondary side is shorted. Note that there is no phase change at (frs+fro)/2 and frs, and the input/output voltage phase difference therefore cannot be controlled. The piezoelectric transformer must therefore be driven at a drive frequency other than (frs+fro)/2 and frs.

Furthermore, the phase change due to load change is small at frequencies near where there is zero phase change. More specifically, if the piezoelectric transformer is driven at a frequency in the range frs or (frs+fro)/2±0.3 kHz, operational errors may occur as a result of the small phase change. It is therefore preferable to drive the piezoelectric transformer at a frequency outside this frequency band.

Moreover, it is preferable to not drive the piezoelectric transformer at a frequency where the variation in the phase difference between the piezoelectric transformer output and FET switching signals due to a change in the CCFL load is zero.

Furthermore, the same effect can be achieved even if the drive frequency is frs and (frs+fro)/2 if there is a simple phase difference between the piezoelectric transformer output and FET switching signals due to a change in the CCFL load.

It should be noted that while a center drive type piezoelectric transformer as shown in FIG. 2 is used as the piezoelectric transformer in the preferred embodiment described above, the same effect can be achieved with various other configurations, such as shown in FIG. 20 and FIG. 21, insofar as the piezoelectric transformer has two secondary electrodes and outputs 180° different phase voltages from the two electrodes.

Embodiment 3

Figure 16:
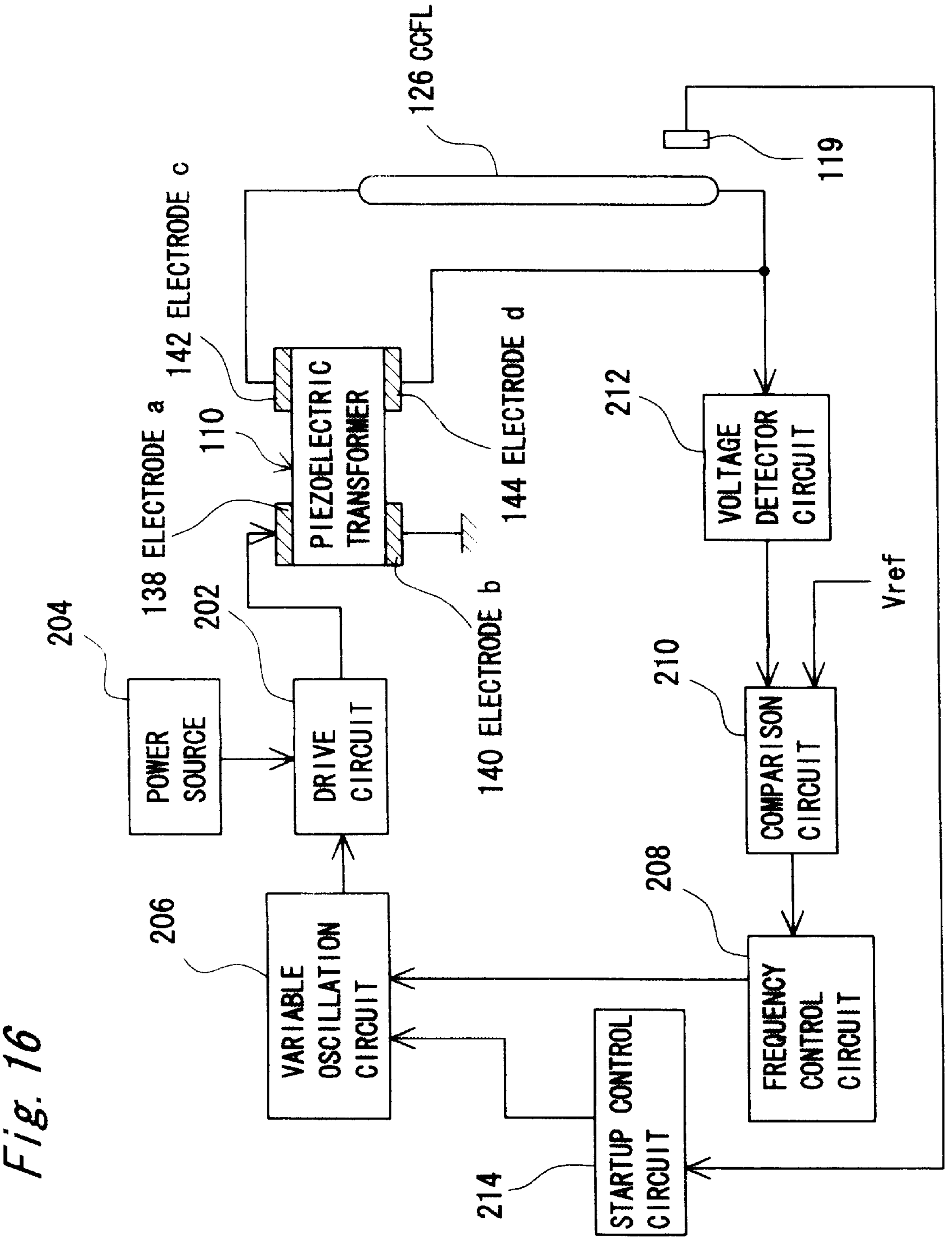
FIG. 16 is a block diagram of a third embodiment of the invention.

FIG. 16 is a block diagram of a CCFL drive circuit according to a third preferred embodiment of the present invention. Note that the configuration and operation of the piezoelectric transformer 110 in this embodiment are the same as in the first and second embodiments.

Referring to FIG. 16, variable oscillation circuit 206 generates the ac signal for driving the piezoelectric transformer 110. Drive circuit 202 drives the piezoelectric transformer 110 based on the signal from variable oscillation circuit 206 using power source 204. The drive circuit 202 is connected to primary electrode a 138 of piezoelectric transformer 110. The other electrode b 140 is to ground. The secondary electrodes c 142 and d 144 of piezoelectric transformer 110 are connected to the end electrical terminals of CCFL 126.

Voltage detector circuit 212 detects the high potential occurring at the secondary side of piezoelectric transformer 110, and is connected to electrode d 144 of piezoelectric transformer 110. Comparison circuit 210 compares the output voltage from voltage detector circuit 212 with reference voltage Vref. Frequency control circuit 208 outputs to variable oscillation circuit 206 a signal for controlling the frequency of the ac drive signal output from variable oscillation circuit 206 based on output from comparison circuit 210. Startup control circuit 214 outputs to variable oscillation circuit 206 until the CCFL 126 strikes. Photodiode 119 detects CCFL 126 startup, and is connected to startup control circuit 214.

Operation of the piezoelectric transformer drive circuit thus comprised is described next below with reference to FIG. 16 and FIG. 15, starting with operation when the CCFL 126 starts up.

The startup control circuit 214 outputs a signal to variable oscillation circuit 206, which controls the drive frequency, while the CCFL 126 starts up.

As in the first and second embodiments, the startup control circuit 214 controls the variable oscillation circuit 206 until the output voltage of the piezoelectric transformer 110 reaches the threshold voltage at which the CCFL 126 strikes. The variable oscillation circuit 206 changes the frequency of the ac drive signal according to the signal from startup control circuit 214. The drive circuit 202 reduces components other than the piezoelectric transformer drive frequency in the ac drive signal from the variable oscillation circuit 206 to obtain the desired ac drive signal. The drive circuit 202 also uses power source 204 to amplify the drive signal to a level sufficient to drive the piezoelectric transformer 110, and applies the amplified ac signal to the primary electrode a 138 of piezoelectric transformer 110. The input ac voltage is stepped up by the piezoelectric effect, and output as a high potential signal from electrode c 142 and electrode d 144. The high potential output from electrode c 142 and electrode d 144 is applied to the ends of CCFL 126, which thus strikes. When the CCFL 126 strikes, CCFL startup is detected from the brightness detected by photodiode 119, for example, and startup control circuit 214 stops operating.

Operation of the piezoelectric transformer drive circuit once the CCFL 126 is on is described next.

Output from variable oscillation circuit 206 is input to drive circuit 202. The drive circuit 202 reduces components other than the piezoelectric transformer drive frequency to obtain the desired ac signal. The drive circuit 202 also uses power source 204 to amplify the drive signal to a level sufficient to drive the piezoelectric transformer 110, and applies the amplified ac signal to the primary electrode a 138 of piezoelectric transformer 110. The input ac voltage is stepped up by the piezoelectric effect, and removed as a high potential signal from secondary electrodes c 142 and d 144. The high potential output from electrode c 142 and electrode d 144 is applied to the ends of CCFL 126. The high potential signals applied to both ends of the CCFL 126 at this time have the same frequency but 180° different phase. The high voltage signal occurring at electrode d 144 of piezoelectric transformer 110 is also input to voltage detector circuit 212.

In this preferred embodiment the voltage applied to CCFL 126 is compared with a desired, predetermined reference voltage required to maintain CCFL 126 operating, and the drive frequency is varied by the frequency control circuit 208 so that the applied voltage and reference voltage are equal. This control method is further described below.

Figure 17:
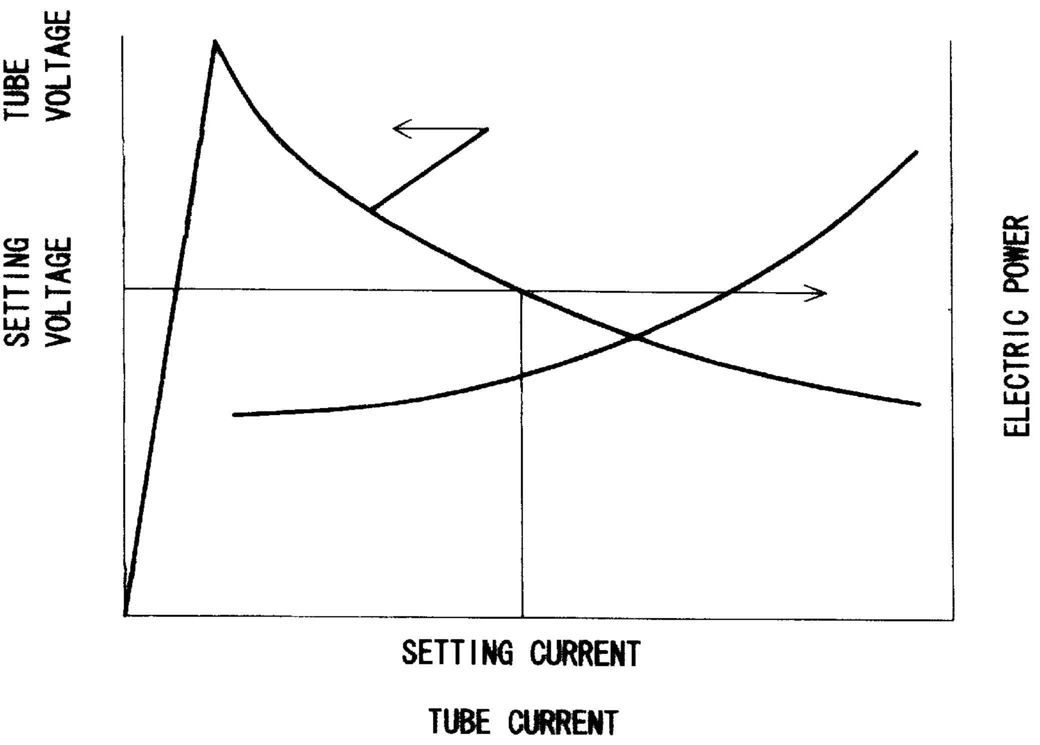
FIG. 17 shows CCFL characteristics.

FIG. 17 shows the voltage-current characteristic and the power-current characteristic of the CCFL 126. The CCFL 126 exhibits a negative resistance characteristic as shown in FIG. 17. Power consumption by the CCFL 126 also increases as the tube current increases.

Figure 18:
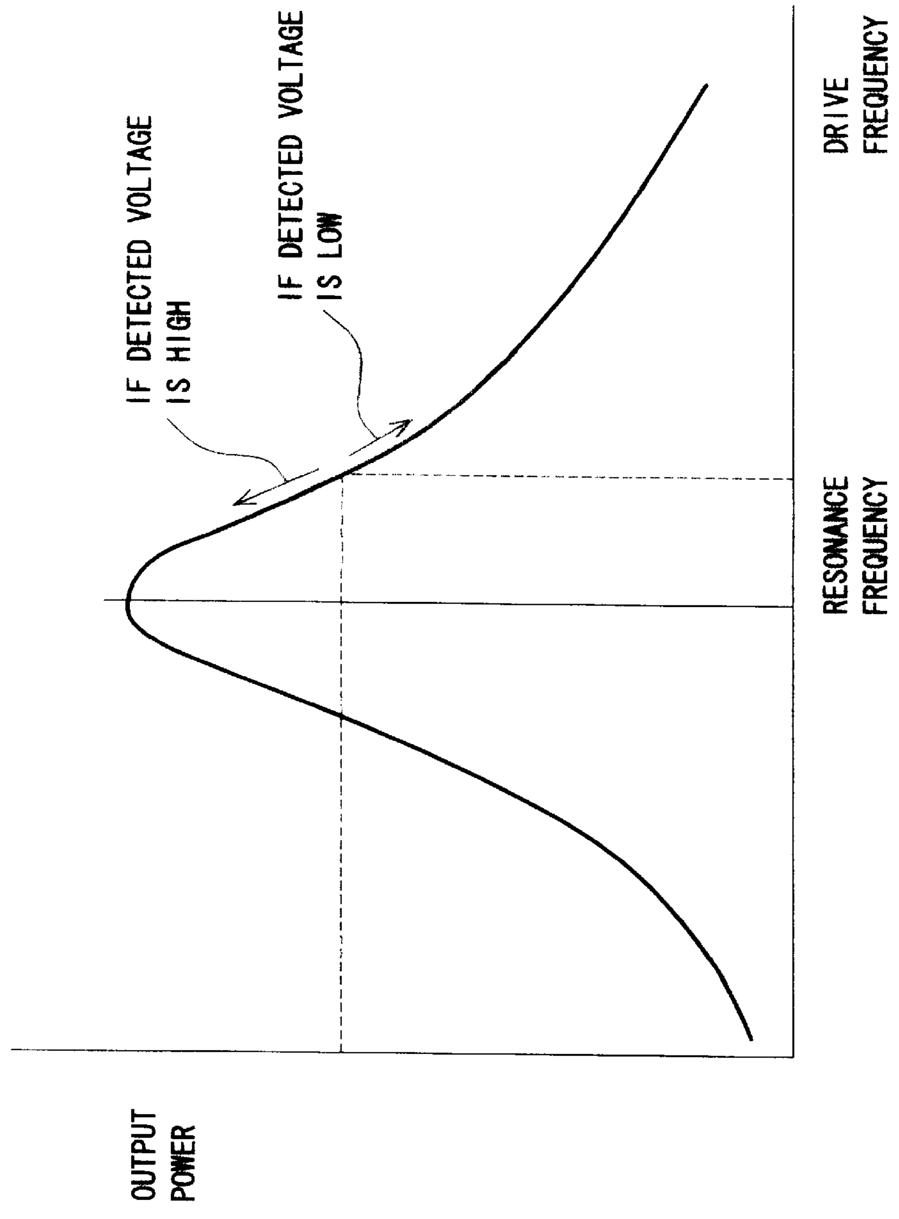
FIG. 18 shows the step-up ratio of the piezoelectric transformer.

FIG. 18 shows the frequency characteristic of output power from the piezoelectric transformer 110. When the output voltage (that is, the voltage applied to the CCFL 126) of piezoelectric transformer 110 is higher than the reference voltage, current flow in the CCFL 126 is lower than the desired current flow. The drive frequency of the piezoelectric transformer 110 is therefore shifted toward the resonance frequency in order to lower the voltage applied to the CCFL 126. This increases output power from the piezoelectric transformer 110. When output power increases, the power supply to the CCFL 126 increases. CCFL impedance thus drops, the power supplied to the CCFL 126 rises as shown in FIG. 17, and as a result the voltage applied to CCFL 126 drops.

Conversely, when the piezoelectric transformer output voltage (CCFL input voltage) is below the reference voltage, current flow in the CCFL 126 is greater than desired. The drive frequency of the piezoelectric transformer 110 is therefore shifted away from the resonance frequency in order to increase the voltage applied to the CCFL 126. This causes the piezoelectric transformer 110 output power to drop. When output power drops, power supply to the CCFL 126 drops. CCFL impedance thus rises, power supplied to the CCFL 126 drops as shown in FIG. 17, and as a result the voltage applied to the CCFL 126 rises.

The voltage applied to the CCFL 126 can therefore be set equal to the reference voltage by thus controlling the drive frequency. The circuit shown in FIG. 16 thus controls the piezoelectric transformer as follows.

The high potential signal input to voltage detector circuit 212 is output to comparison circuit 210 as a dc voltage corresponding to the sinusoidal output voltage of piezoelectric transformer 110. The comparison circuit 210 sends a control signal to frequency control circuit 208 so that the output from voltage detector circuit 212 is equal to the reference voltage Vref required to keep CCFL 126 operating. The frequency control circuit 208 controls the frequency at which variable oscillation circuit 206 oscillates according to the output from comparison circuit 210.

The comparison circuit 210 compares the voltage applied to CCFL 126 with reference voltage Vref, and the frequency control circuit 208 controls the frequency so that the voltage applied to CCFL 126 becomes equal to reference voltage Vref. It is therefore possible to control CCFL 126 current flow, that is, brightness, when the secondary side is floating.

It should be noted that while a center drive type piezoelectric transformer as shown in FIG. 2 is used as the piezoelectric transformer 110 in the preferred embodiment described above, the same effect can be achieved with various other configurations, such as shown in FIG. 20 and FIG. 21, insofar as the piezoelectric transformer has two secondary electrodes and outputs 180° different phase voltages from the two electrodes.

Embodiment 4

Figure 19:
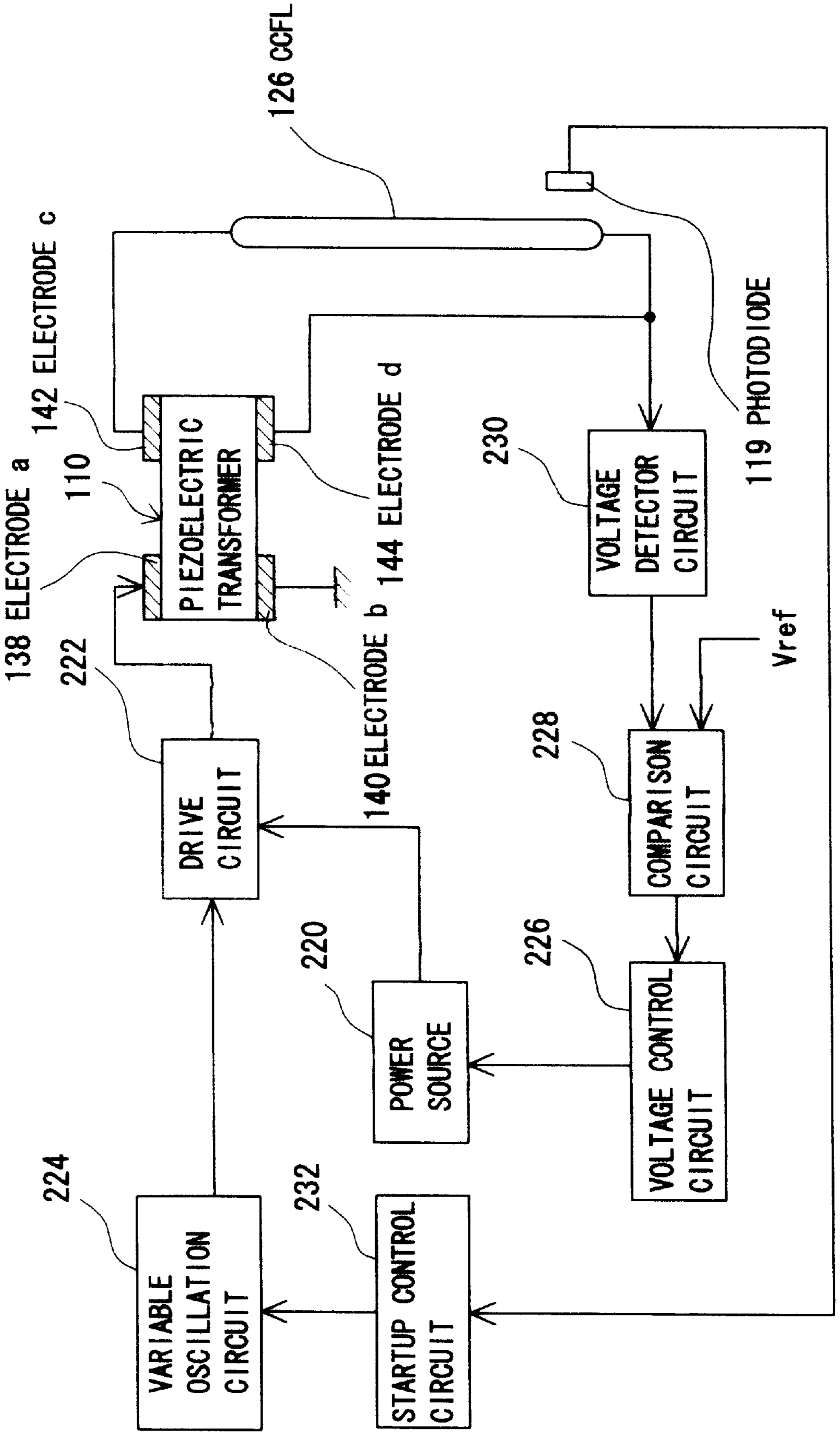
FIG. 19 is a block diagram of a fourth embodiment of the invention.

FIG. 19 is a block diagram of a CCFL drive circuit according to a fourth preferred embodiment of the present invention. This embodiment differs from the third embodiment in that the piezoelectric transformer drive frequency is fixed, and CCFL brightness is controlled by controlling the power supply voltage. Note that the configuration and operation of the piezoelectric transformer 110 in this embodiment are the same as in the first and second embodiments.

Referring to FIG. 19, variable oscillation circuit 224 generates the ac signal for driving the piezoelectric transformer 110. Drive circuit 222 drives the piezoelectric transformer 110 based on the signal from variable oscillation circuit 224, and is connected to power supply 220. The drive circuit 222 is also connected to primary electrode a 138 of piezoelectric transformer 110. The other electrode b 140 is to ground. The secondary electrodes c 142 and d 144 of piezoelectric transformer 110 are connected to the end electrical terminals of CCFL 126.

Voltage detector circuit 230 detects the high potential occurring at the secondary side of piezoelectric transformer 110, and is connected to electrode d 144 of piezoelectric transformer 110. Comparison circuit 228 compares the output voltage from voltage detector circuit 230 with reference voltage Vref. Voltage control circuit 226 controls power supply 220 output based on output from comparison circuit 228. Startup control circuit 232 outputs to variable oscillation circuit 224 until the CCFL 126 strikes. Photodiode 119 detects CCFL 126 startup, and is connected to startup control circuit 232.

Operation of the piezoelectric transformer drive circuit thus comprised is described next below, starting with operation when the CCFL 126 starts up.

Referring to FIG. 19, startup control circuit 232 outputs a signal to variable oscillation circuit 224, which controls the drive frequency, while the CCFL 126 starts up. As in the first and second embodiments, the startup control circuit 232 controls the variable oscillation circuit 224 until the output voltage of the piezoelectric transformer 110 reaches the threshold voltage at which the CCFL 126 strikes.

The variable oscillation circuit 224 changes the frequency of the ac drive signal according to the signal from startup control circuit 232. The drive circuit 222 reduces components other than the piezoelectric transformer drive frequency in the ac drive signal from the variable oscillation circuit 224 to obtain the desired ac drive signal. The drive circuit 222 also uses power source 220 to amplify the drive signal to a level sufficient to drive the piezoelectric transformer 110, and applies the amplified ac signal to the primary electrode a 138 of piezoelectric transformer 110. The input ac voltage is stepped up by the piezoelectric effect, and output as a high potential signal from electrode c 142 and electrode d 144. The high potential output from electrode c 142 and electrode d 144 is applied to the ends of CCFL 126, which thus strikes. When the CCFL 126 strikes, CCFL startup is detected from the brightness detected by photodiode 119, for example, and startup control circuit 214 stops operating.

Operation of the piezoelectric transformer drive circuit once the CCFL 126 is on is described next.

Output from variable oscillation circuit 224 is input to drive circuit 222. The drive circuit 222 reduces components other than the piezoelectric transformer drive frequency to obtain the desired ac signal. The drive circuit 222 also uses power source 220 to amplify the drive signal to a level sufficient to drive the piezoelectric transformer 110, and applies the amplified ac signal to the primary electrode a 138 of piezoelectric transformer 110. The input ac voltage is stepped up by the piezoelectric effect, and removed as a high potential signal from secondary electrodes c 142 and d 144. The high potential output from electrode c 142 and electrode d 144 is applied to the ends of CCFL 126. The high potential signals applied to both ends of the CCFL 126 at this time have the same frequency but 180° different phase. The high voltage signal occurring at electrode d 144 of piezoelectric transformer 110 is also input to voltage detector circuit 230.

In this preferred embodiment the voltage applied to CCFL 126 compared with a desired, predetermined reference voltage required to maintain CCFL 126 operating, and the power supply voltage is controlled by the voltage control circuit 226 so that the applied voltage and reference voltage are equal. This control method is further described below.

FIG. 17 shows the voltage-current characteristic and the power-current characteristic of the CCFL 126. The CCFL 126 exhibits a negative resistance characteristic as shown in FIG. 17. Power consumption by the CCFL 126 also increases as the tube current increases.

When the output voltage (that is, the voltage applied to the CCFL 126) of piezoelectric transformer 110 is higher than the reference voltage, current flow in the CCFL 126 is lower than the desired current flow. The input voltage of the piezoelectric transformer 110 is therefore increased in order to increase the output power of the piezoelectric transformer 110. When the piezoelectric transformer 110 output power rises, the power supply to the CCFL 126 increases and CCFL impedance drops. When CCFL 126 impedance drops, the power supplied to the CCFL 126 rises, and the voltage applied to CCFL 126 drops as a result.

Conversely, when the piezoelectric transformer output voltage (CCFL input voltage) is below the reference voltage, current flow in the CCFL 126 is greater than desired. The input voltage to piezoelectric transformer 110 is therefore lowered to lower piezoelectric transformer 110 output power. When piezoelectric transformer 110 output power drops, the power supplied to the CCFL 126 drops. CCFL impedance thus rises. When CCFL 126 impedance rises, power supplied to the CCFL 126 drops, and as a result the voltage applied to the CCFL 126 rises.

The voltage applied to the CCFL 126 can therefore be set equal to the reference voltage by thus controlling the supply voltage. The circuit shown in FIG. 19 thus controls the piezoelectric transformer as follows.

The high potential signal input to voltage detector circuit 230 is output to comparison circuit 228 as a dc voltage corresponding to the sinusoidal output voltage of piezoelectric transformer 110. The comparison circuit 210 sends a control signal to voltage control circuit 226 so that the output from voltage detector circuit 230 is equal to the reference voltage Vref required to keep CCFL 126 operating. The voltage control circuit 226 controls the power supply 220 to adjust the voltage input to piezoelectric transformer 110 according to the output from comparison circuit 228.

The comparison circuit 228 compares the voltage applied to CCFL 126 with reference voltage Vref, and the voltage control circuit 226 controls the power supply so that the voltage applied to CCFL 126 becomes equal to reference voltage Vref. It is therefore possible to control CCFL 126 current flow, that is, brightness, when the secondary side is floating.

It should be noted that while a center drive type piezoelectric transformer as shown in FIG. 2 is used as the piezoelectric transformer 110 in the preferred embodiment described above, the same effect can be achieved with various other configurations, such as shown in FIG. 20 and FIG. 21, insofar as the piezoelectric transformer has two secondary electrodes and outputs 180° different phase voltages from the two electrodes.

As described above, the cold cathode fluorescent lamp driving method using a piezoelectric transformer according to the present invention can maintain the cold cathode fluorescent lamp at a constant brightness level by detecting and controlling to a constant level the phase difference between the input and output side voltages of the piezoelectric transformer or the output voltage of the piezoelectric transformer (the voltage applied to the cold cathode fluorescent lamp) in a piezoelectric transformer having separated primary and secondary sides.

Furthermore, the cold cathode fluorescent lamp driving method of the present invention using a fixed frequency piezoelectric transformer reduces transformer loss because it can drive the piezoelectric transformer at an efficient frequency using a sinusoidal wave.

Yet further, the absolute value of the voltage applied to the cold cathode fluorescent lamp by the drive circuit of the present invention is half that used by the prior art, the drive circuit provides a highly reliable, compact piezoelectric inverter that is extremely beneficial with numerous practical applications.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The present disclosure relates to subject matter contained in priority Japanese Patent Application No. 2000-402001, filed on Dec. 28, 2000, the contents of which is herein expressly incorporated by reference in its entirety.

What is claimed is:

1. A drive device for one or a plurality of series-connected cold cathode fluorescent lamps having an electrical terminal at both ends, comprising:

a piezoelectric transformer having a pair of primary electrodes and first and second secondary electrodes, said piezoelectric transformer converting a primary ac input from the primary electrodes by a piezoelectric effect to a secondary ac output, outputting a secondary output in a first phase from the first secondary electrode and outputting a secondary output in a second phase opposite the first phase from the second secondary electrode, and enabling connection of the electrical terminals at both ends of the cold cathode fluorescent lamp between the first secondary electrode and the second secondary electrode;

a drive arrangement for applying the primary ac input to the primary electrodes; and a brightness control circuit for controlling cold cathode fluorescent lamp brightness by detecting a phase difference between the secondary ac output and primary ac input such that, when the detected phase difference is greater than a specified phase difference, the drive arrangement reduces the input power to the primary electrodes of the piezoelectric transformer to reduce the lamp brightness, and when the detected phase difference is less than a specified phase difference, the drive arrangement increases the input power to the primary electrodes of the piezoelectric transformer to increase the lamp brightness.

2. A cold cathode fluorescent lamp drive device according to claim 1, further comprising:

a variable oscillation circuit for oscillating the primary ac input at a specified frequency;

a startup control circuit for controlling the frequency of the primary ac input from the variable oscillation circuit to strike the cold cathode fluorescent lamp; and startup detector for detecting cold cathode fluorescent lamp startup.

3. A cold cathode fluorescent lamp drive device according to claim 2, wherein the startup control circuit controls the variable oscillation circuit to sweep the primary ac input from a specified frequency to a frequency below said frequency to strike the cold cathode fluorescent lamp, and controls the variable oscillation circuit to fix and oscillate at the frequency at which the startup detector detects cold cathode fluorescent lamp startup.

4. A cold cathode fluorescent lamp drive device according to claim 2, wherein the brightness control circuit stops operating when striking the cold cathode fluorescent lamp.

5. A cold cathode fluorescent lamp drive device according to claim 2, wherein the frequency of the primary ac input is a frequency other than a frequency at which the secondary side of the piezoelectric transformer shorts, and a frequency intermediate to the frequency at which the piezoelectric transformer secondary side shorts and the secondary side opens.

6. A cold cathode fluorescent lamp drive device according to claim 2, wherein the primary ac input frequency is a frequency other than a frequency in the band ±0.3 kHz of the piezoelectric transformer resonance frequency when the secondary side shorts, and a frequency other than a frequency in the band ±0.3 kHz of the frequency intermediate to the resonance frequency of the piezoelectric transformer when the secondary side shorts and the resonance frequency when the secondary side is open.

7. A cold cathode fluorescent lamp drive device according to claim 2, wherein the frequency of the primary ac input is higher than the frequency of the maximum step-up ratio of the piezoelectric transformer producing the lowest cold cathode fluorescent lamp load.

8. A cold cathode fluorescent lamp drive device according to claim 1, further comprising an inductor connected in series with one primary electrode, forming a resonance circuit with the piezoelectric transformer;

wherein the drive arrangement comprises a dc power source, a drive control circuit for outputting a drive control signal based on the primary ac input frequency, and a drive circuit connected to the dc power source and both sides of the resonance circuit for amplifying the drive control signal to a voltage level required to drive the piezoelectric transformer, outputting the ac input signal to the resonance circuit, and inputting the ac voltage to the primary electrodes; and the brightness control circuit comprises a voltage detector circuit for detecting the ac voltage of the secondary ac output from at least one of the first and second secondary electrodes, and outputting an ac detection signal, a phase difference detector circuit for detecting a phase difference between the ac input signal and detected ac signal, and outputting a dc voltage according to the detected phase difference, a phase control circuit for controlling the phase of the drive control signal, and a comparison circuit for comparing the dc voltage and a reference voltage, and controlling the phase control circuit so that the dc voltage and reference voltage match.

9. A cold cathode fluorescent lamp drive device according to claim 8, wherein the ac input signal frequency is near the resonance frequency of the resonance circuit.

10. A cold cathode fluorescent lamp drive device according to claim 8, wherein the voltage detector circuit comprises:

a level shifter for shifting the ac voltage of the secondary ac output to a specific voltage amplitude level; and a zero cross detection circuit for switching and outputting the ac detection signal when the level shifter output signal crosses zero.

11. A cold cathode fluorescent lamp drive device according to claim 8, wherein the phase detector circuit comprises:

a logical AND for taking the AND of the ac input signal and ac detection signal, and outputting a phase difference signal; and an averaging circuit for averaging the phase difference signal and outputting a dc voltage.

12. A cold cathode fluorescent lamp drive device according to claim 8, wherein the drive circuit comprises:

a first series connection having a first switching element and a second switching element connected in series;

a second series connection parallel connected to the first series connection and having a third switching element and a fourth switching element connected in series;

a first element drive circuit connected to the first switching element for driving the first switching element;

a second element drive circuit connected to the second switching element for driving the second switching element;

a third element drive circuit connected to the third switching element for driving the third switching element; and a fourth element drive circuit connected to the fourth switching element for driving the fourth switching element.

13. A cold cathode fluorescent lamp drive device according to claim 12, wherein the resonance circuit is connected between the node between the first switching element and second switching element, and the node between the third switching element and fourth switching element.

14. A cold cathode fluorescent lamp drive device according to claim 13, wherein the drive control signal comprises:

a first element control signal for driving the first element drive circuit;

a second element control signal for driving the second element drive circuit;

a third element control signal for driving the third element drive circuit; and a fourth element control signal for driving the fourth element drive circuit.

15. A cold cathode fluorescent lamp drive device according to claim 14, wherein the first element control signal and second element control signal are controlled by the drive control circuit so that the first switching element and second switching element switch alternately on and off at a specific on time ratio; and the third element control signal and fourth element control signal are controlled by the drive control circuit so that the third switching element and fourth switching element switch alternately on and off at the same frequency and on time ratio as the first element control signal and second element control signal.

16. A cold cathode fluorescent lamp drive device according to claim 15, wherein the ac input signal is a combined rectangular signal combining the first element control signal, second element control signal, third element control signal, and fourth element control signal.

17. A cold cathode fluorescent lamp drive device according to claim 14, wherein the first element control signal, second element control signal, third element control signal, or fourth element control signal is used in place of the ac input signal for phase difference signal detection.

18. A cold cathode fluorescent lamp device comprising:

a cold cathode fluorescent lamp drive device according to claim 1; and one or a plurality of series-connected cold cathode fluorescent lamps having an electrical terminal at both ends connected between one and another of first and second secondary electrodes of the piezoelectric transformer.

19. A drive device for one or a plurality of series-connected cold cathode fluorescent lamps having an electrical terminal at both ends, comprising:

a piezoelectric transformer having a pair of primary electrodes and first and second secondary electrodes, said piezoelectric transformer converting a primary ac input from the primary electrodes by a piezoelectric effect to a secondary ac output, outputting a secondary output in a first phase from the first secondary electrode and outputting a secondary output of a second phase opposite the first phase from the second secondary electrode, and enabling connection of the electrical terminals at both ends of the cold cathode fluorescent lamp between the first secondary electrode and the second secondary electrode;

a variable oscillation circuit for oscillating the primary ac input at a specified frequency;

a drive arrangement for applying the primary ac input to the primary electrodes; and a brightness control circuit for controlling cold cathode fluorescent lamp brightness by detecting an ac voltage of the secondary ac output applied to the end electrical terminals of the cold cathode fluorescent lamp such that, when the detected ac voltage of the secondary ac output is greater than a specific voltage, the primary ac input frequency approaches the resonance frequency of the piezoelectric transformer by the variable oscillation circuit, and when the detected ac voltage of the secondary ac output is less than the specific voltage, the primary ac input frequency recedes from the resonance frequency of the piezoelectric transformer by the variable oscillation circuit.

20. A drive device for one or a plurality of series-connected cold cathode fluorescent lamps having an electrical terminal at both ends, comprising:

a piezoelectric transformer having a pair of primary electrodes and first and second secondary electrodes, said piezoelectric transformer converting a primary ac input from the primary electrodes by a piezoelectric effect to a secondary ac output, outputting a secondary output in a first phase from the first secondary electrode and outputting a secondary output of a second phase opposite the first phase from the second secondary electrode, and enabling connection of the electrical terminals at both ends of the cold cathode fluorescent lamp between the first secondary electrode and the second secondary electrode;

a drive arrangement for applying the primary ac input to the primary electrodes; and a brightness control circuit for controlling cold cathode fluorescent lamp brightness by detecting an ac voltage of the secondary ac output such that, when the detected ac voltage of the secondary ac output is greater than a specific voltage, the drive arrangement reduces the ac voltage of the primary ac input to reduce the lamp brightness, and when the detected ac voltage of the secondary ac output is less than a specific voltage, the drive arrangement increases the ac voltage of the primary ac input to increase the lamp brightness.

21. A drive method for one or a plurality of series-connected cold cathode fluorescent lamps having an electrical terminal at both ends, comprising:

applying a primary ac input from a drive arrangement to primary electrodes of a piezoelectric transformer, the piezoelectric transformer having a pair of primary electrodes and first and second secondary electrodes, converting the primary ac input from the primary electrodes by a piezoelectric effect to a secondary ac output, outputting a secondary output in a first phase from the first secondary electrode and outputting a secondary output in a second phase opposite the first phase from the second secondary electrode;

striking the cold cathode fluorescent lamp connected with both end electrical terminals thereof connected between the first and the second secondary electrodes by applying the first phase secondary ac output to one of the electrical terminals, and applying the second phase second ac output to the other electrical terminal;

detecting a phase difference between the secondary ac output and primary ac input by means of a brightness control circuit for controlling cold cathode fluorescent lamp brightness;

controlling the drive arrangement to reduce primary ac input power to the primary electrodes of the piezoelectric transformer when the detected phase difference is greater than a specified phase difference; and controlling the drive arrangement to increase primary ac input power to the primary electrodes of the piezoelectric transformer when the detected phase difference is less than a specified phase difference.

22. A cold cathode fluorescent lamp drive method according to claim 21, whereby a variable oscillation circuit for oscillating the primary ac input is controlled to sweep the primary ac input from a specified frequency to a frequency below said frequency to strike the cold cathode fluorescent lamp, and is controlled to fix and oscillate at the frequency at which cold cathode fluorescent lamp startup is detected.

23. A cold cathode fluorescent lamp drive method according to claim 21, wherein the frequency of the primary ac input is a frequency other than a frequency at which the secondary side of the piezoelectric transformer shorts, and a frequency intermediate to the frequency at which the piezoelectric transformer secondary side shorts and the secondary side opens.

24. A cold cathode fluorescent lamp drive method according to claim 21, wherein the primary ac input frequency is a frequency other than a frequency in the band ±0.3 kHz of the piezoelectric transformer resonance frequency when the secondary side shorts, and a frequency other than a frequency in the band ±0.3 kHz of the frequency intermediate to the resonance frequency of the piezoelectric transformer when the secondary side shorts and the resonance frequency when the secondary side is open.

25. A cold cathode fluorescent lamp drive method according to claim 21, wherein the frequency of the primary ac input is higher than the frequency of the maximum step-up ratio of the piezoelectric transformer producing the lowest cold cathode fluorescent lamp load.

26. A cold cathode fluorescent lamp drive method according to claim 21, wherein the primary ac input comprises the pulse signals of a plurality of switching elements driven by pulse signals, and the primary ac input is applied to the primary electrodes; and phase difference detection by the brightness control circuit detects a phase difference between pulse signals input to the switching elements, and the secondary ac output converted to a rectangular wave pulse signal by zero cross detection.

27. A drive method for one or a plurality of series-connected cold cathode fluorescent lamps having an electrical terminal at both ends, comprising:

applying a primary ac input oscillated by a variable oscillation circuit from a drive arrangement to primary electrodes of a piezoelectric transformer, the piezoelectric transformer having a pair of primary electrodes and first and second secondary electrodes, the piezoelectric transformer converting the primary ac input from the primary electrodes by a piezoelectric effect to a secondary ac output, outputting a secondary output in a first phase from the first secondary electrode and outputting a secondary output in a second phase opposite the first phase from the second secondary electrode;

striking the cold cathode fluorescent lamp connected with both end electrical terminals thereof connected between the first and second secondary electrodes by applying the first phase secondary ac output to one of the electrical terminals, and applying the second phase second ac output to the other electrical terminal;

detecting an ac voltage of the secondary ac output applied to the end electrical terminals of the cold cathode fluorescent lamp by means of a brightness control circuit for controlling cold cathode fluorescent lamp brightness;

controlling the drive arrangement to reduce the ac voltage of the primary ac input when the detected ac voltage of the secondary ac output is greater than a specified voltage;

controlling the drive arrangement to increase the ac voltage of the primary ac input when the detected ac voltage of the secondary ac output is less than a specified voltage; and making the detected ac voltage of the secondary ac output equal to the specified voltage.

28. A drive method for one or a plurality of series-connected cold cathode fluorescent lamps having an electrical terminal at both ends, comprising:

applying a primary ac input oscillated by a variable oscillation circuit from a drive arrangement to primary electrodes of a piezoelectric transformer, the piezoelectric transformer having a pair of primary electrodes and first and second secondary electrodes, converting the primary ac input from the primary electrodes by a piezoelectric effect to a secondary ac output, outputting a secondary output in a first phase from the first secondary electrode and outputting a secondary output in a second phase opposite the first phase from the second secondary electrode;

striking the cold cathode fluorescent lamp connected with both end electrical terminals thereof connected between the first and the second secondary electrodes by applying the first phase secondary ac output to one of the electrical terminals, and applying the second phase second ac output to the other electrical terminal;

detecting an ac voltage of the secondary ac output applied to the end electrical terminals of the cold cathode fluorescent lamp by means of a brightness control circuit for controlling cold cathode fluorescent lamp brightness;

controlling the variable oscillation circuit so that the primary ac input frequency approaches the resonance frequency of the piezoelectric transformer when the detected ac voltage of the secondary ac output is greater than a specific voltage;

controlling the variable oscillation circuit so that the primary ac input frequency recedes from the resonance frequency of the piezoelectric transformer when the detected ac voltage of the secondary ac output is less than the specific voltage; and making the detected ac voltage of the secondary ac output and the specific voltage equal.

* * * * *